US008209648B1

(12) United States Patent
Ku et al.

(10) Patent No.: US 8,209,648 B1
(45) Date of Patent: Jun. 26, 2012

(54) VERIFYING MULTIPLE CONSTRAINTS FOR CIRCUIT DESIGNS

(75) Inventors: Shan-Chyun Ku, Hsinchu (TW); Marcelo Glusman, San Jose, CA (US); Yee-Wing Hsieh, Pleasanton, CA (US); Manish Pandey, Saratoga, CA (US); Angela Krstic, San Diego, CA (US); Sarath Kirihennedige, Fremont, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 303 days.

(21) Appl. No.: 12/553,965

(22) Filed: Sep. 3, 2009

(51) Int. Cl.
*G06F 17/50* (2006.01)
*G06F 9/455* (2006.01)

(52) U.S. Cl. ........ 716/108; 716/111; 716/113; 716/114; 716/122; 716/134; 716/136

(58) Field of Classification Search .................. 716/108, 716/111, 113–114, 122, 134, 136
See application file for complete search history.

(56) References Cited

U.S. PATENT DOCUMENTS

| 5,461,576 | A  | * | 10/1995 | Tsay et al. | 716/113 |
| 7,373,621 | B1 | * | 5/2008  | Dastidar    | 714/726 |
| 7,849,429 | B2 | * | 12/2010 | Hemmett et al. | 716/113 |
| 2004/0117772 | A1 | * | 6/2004  | Brand et al. | 717/132 |

OTHER PUBLICATIONS

Cadence Design Systems, Inc.—'Encounter Conformal Constraint Designer Reference Manual'; cover page, copyright page (pp. 1-2), TOC (pp. 3-24), "About this manual" (pp. 25-26), and select-commands (pp. 245-246, 680-686, 790-805, 864-888, 920-945), Product Version 7.2, Dec. 2007
Cadence Design Systems, Inc.—'Encounter Conformal Constraint Designer User Guide'; cover page, copyright page (pp. 1-2), TOC (pp. 3-14), "About this manual" (pp. 15-16), "Introduction" (pp. 17-48), and "Placing design constraints" (pp. 126-163), Product Version 7.2, Dec. 2007.
Belkhale, Krishna P. et al., 'Timing Analysis with known Flase Sub Graphs'; International Conference on Computer-Aided Design (ICCAD '95), 1995, pp. 736-740.
Chen, Haizhou et al., 'Static Timing Analysis With False Paths'; International Conference on Computer Design (ICCD '00), 2000, pp. 541-544.
Goldberg, Eugene et al., 'Timing Analysis with Implicitly Specified False Paths'; Proceedings of the 13th International Conference on VLSI Design, 2000 IEEE, pp. 518-522.
Higuchi, Hiroyuki, 'An Implication-based Method to Detect Multi-Cycle Paths in Large Sequential Circuits'; 39th Design Automation Conference (DAC '02), Jun. 10-14, 2002, pp. 164-169.
Moon, Cho W. et al., 'Timing Model Extraction of Hierarchical Blocks by Graph Reduction'; Design Automation Conference (DAC '02), Jun. 10-14, 2002, pp. 152-157.
Conte, D. et al., 'Thirty Years of Graph Matching in Pattern Recognition'; International Journal of Pattern Recognition and Artificial Intelligence, vol. 18, No. 3 (2004), pp. 265-298.

* cited by examiner

*Primary Examiner* — Nghia Doan
(74) *Attorney, Agent, or Firm* — Schwegman, Lundberg & Woessner, P.A.

(57) ABSTRACT

Certain embodiments of the present invention enable comparisons between constrained circuit designs by generating timing graphs for circuit designs, mapping timing constraints to the timing graphs, and comparing the mapped timing constraints from different timing graphs. Typically this comparison is made by identifying corresponding nodes in two or more timing graphs. Specific embodiments are also directed to multiple SDC (Synopsis Design Constraint) constraint specifications for a circuit and multiple constraint sets for different operational modes of a circuit.

21 Claims, 22 Drawing Sheets

Single Design SDC Compare

FIG. 9

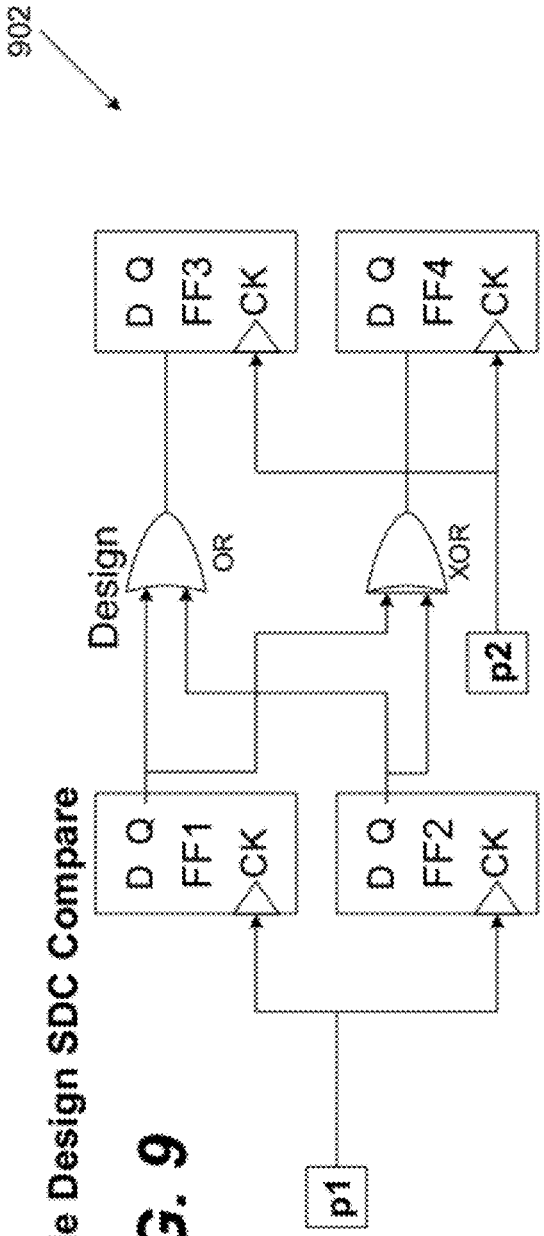

Design Constraints (golden) —904
904a — create_clock –name clk1 –period 2 –waveform { 0 1 } [ get_ports {p1} ]
904b — create_clock –name clk2 –period 3 –waveform { 0 1 } [ get_ports {p2} ]
904c — set_false_path -from [ get_clocks {clk1} ] –to [ get_pins { FF4/D } ]
904d — set_false_path –through [ get_pins {FF2/Q} ] –to [ get_pins {FF3/D} ]

Design Constraints (revised) —906
906a — create_clock –name c1 –period 2 –waveform { 0 1 } [ get_ports {p1} ]
906b — create_clock –name c2 –period 3 –waveform { 0 1 } [ get_ports {p2} ]
906c — set_false_path –through [ get_pins {FF1/Q} ] –to [ get_pins { FF4/D } ]
906d — set_false_path –through [ get_pins {FF2/Q} ] –to [ get_pins { FF4/D } ]

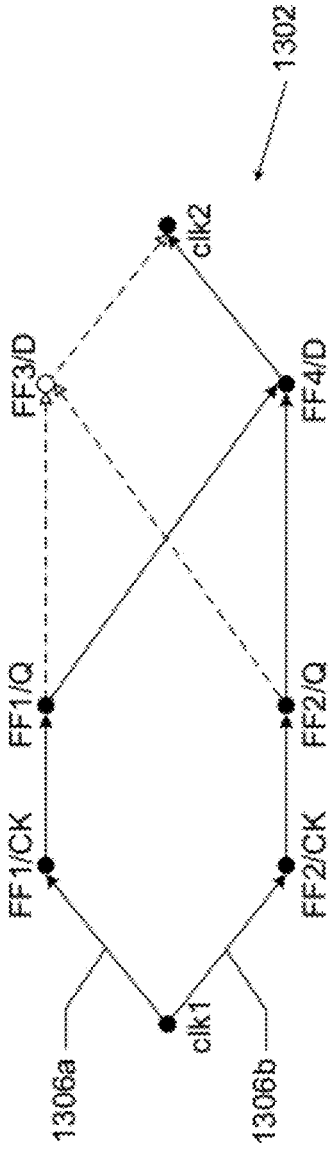
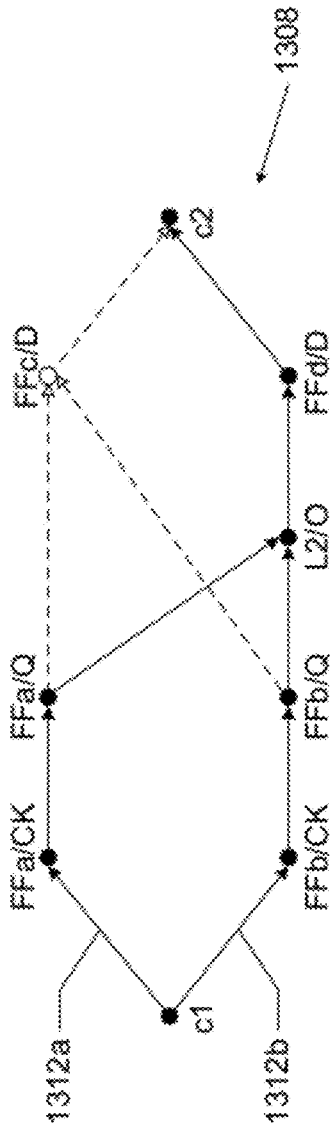
FIG. 13

VERIFYING MULTIPLE CONSTRAINTS FOR CIRCUIT DESIGNS

BACKGROUND OF THE INVENTION

1. Field of Invention

The present invention relates to circuits generally and more particularly to evaluating constrained circuit designs.

2. Description of Related Art

Modern circuit designs have led to increasingly complex timing constraints, expressed as timing constraint specifications in formats such as Synopsys Design Constraints (SDC). These constraints may include, for example, minimal/maximal delays and multi-cycle paths. Additionally some paths may be designated as "timing false paths" (or "false paths") that should not be constrained in the optimization of the design (e.g., because the path relates to a system redundancy). As the original design is further refined in the design flow from RTL (Register Transfer Level) through post-P&R (Placement and Routing) netlist, the original timing constraint specification may no longer be valid. However, comparing different versions of constrained designs is often done line by line or constraint by constraint and without reference to a design-based standard that enables timing constraints to be compared for inconsistent and redundant constraints.

Thus, there is a need for improved verification and comparison of circuit design constraints.

SUMMARY OF THE INVENTION

Certain embodiments of the present invention enable comparisons between two or more different sets of timing constraints by generating timing graphs for circuit designs, mapping timing constraints to the timing graphs, and comparing the mapped timing constraints from different timing graphs. Typically this comparison is made by identifying corresponding nodes in two or more timing graphs. Specific embodiments are also directed to multiple SDC (Synopsis Design Constraint) constraints for a circuit and multiple constraint sets for different operational modes of a circuit.

One embodiment relates to a method of evaluating constrained circuit designs. Constrained designs are specified, where each constrained design includes a circuit design that includes circuit elements and connections between circuit elements, and each constrained design further includes timing constraints for paths along the connections between circuit elements. A timing graph is generated for each circuit design, where each timing graph includes nodes corresponding to circuit elements and edges corresponding to connections between circuit elements. For each circuit design timing constraints are mapped to a timing-graph constraint set for a corresponding timing graph. The constrained designs are evaluated by comparing the timing-graph constraint sets and determining a presence or absence of one or more paths with a constraint error that corresponds to an inconsistent, conflicting or missing constraint. A timing-constraint report is provided to a user, where the timing-constraint report includes values for the presence or absence of one or more paths with a constraint error.

Another embodiment relates to an apparatus for carrying out the above-described method, where the apparatus includes a computer for executing instructions related to the method. For example, the computer may include a processor with memory for executing at least some of the instructions. Additionally or alternatively the computer may include circuitry or other specialized hardware for executing at least some of the instructions. Another embodiment relates to a computer-readable medium that stores (e.g., tangibly embodies) a computer program for carrying out the above-described method with a computer. In these ways the present invention enables improved verification and comparison of circuit design constraints.

BRIEF DESCRIPTION OF THE DRAWINGS

FIG. 9 shows a constrained circuit design for another embodiment of the present invention.

FIG. 13 shows timing graphs for the embodiment of FIGS. 11 and 12.

DETAILED DESCRIPTION OF EXEMPLARY EMBODIMENTS

Figure 1:
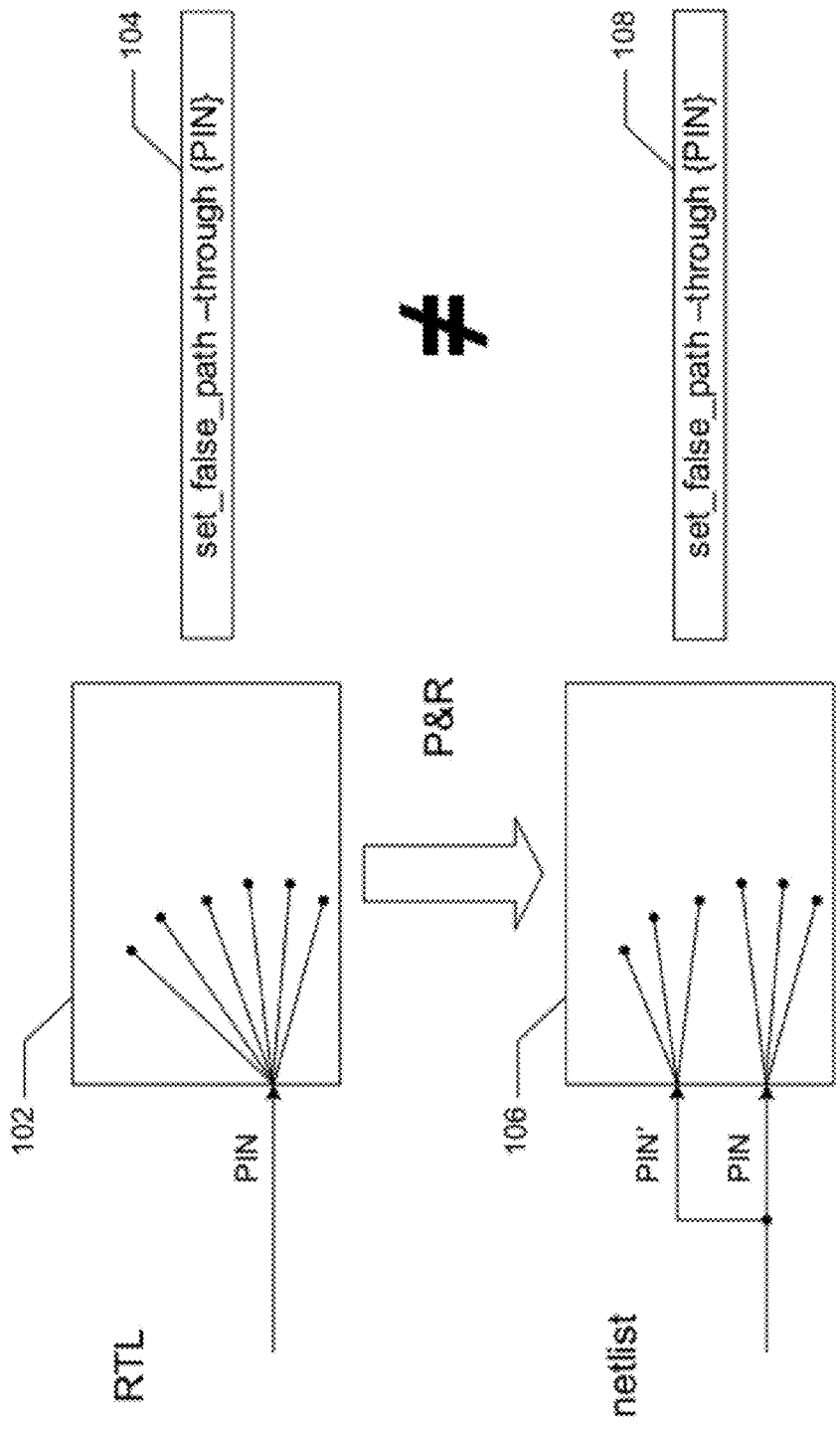
FIG. 1 shows a constraint problem related to port duplication.

FIG. 1 shows a constraint problem related to port duplication. In an RTL (Register Transfer Level) design 102, paths through element PIN are designated as false paths 104. That is, these paths do not in general require a timing constraint in the design because they are redundant or unused. After placement and routing (P&R), a netlist design 106 includes an additional element PIN' which replaces element PIN for some paths. For example, a port corresponding to PIN has been duplicated with an additional port corresponding to PIN'. Then designating false paths through PIN alone 108 is not equivalent to the original constraint 104 since paths through PIN' are not covered.

Figure 2:
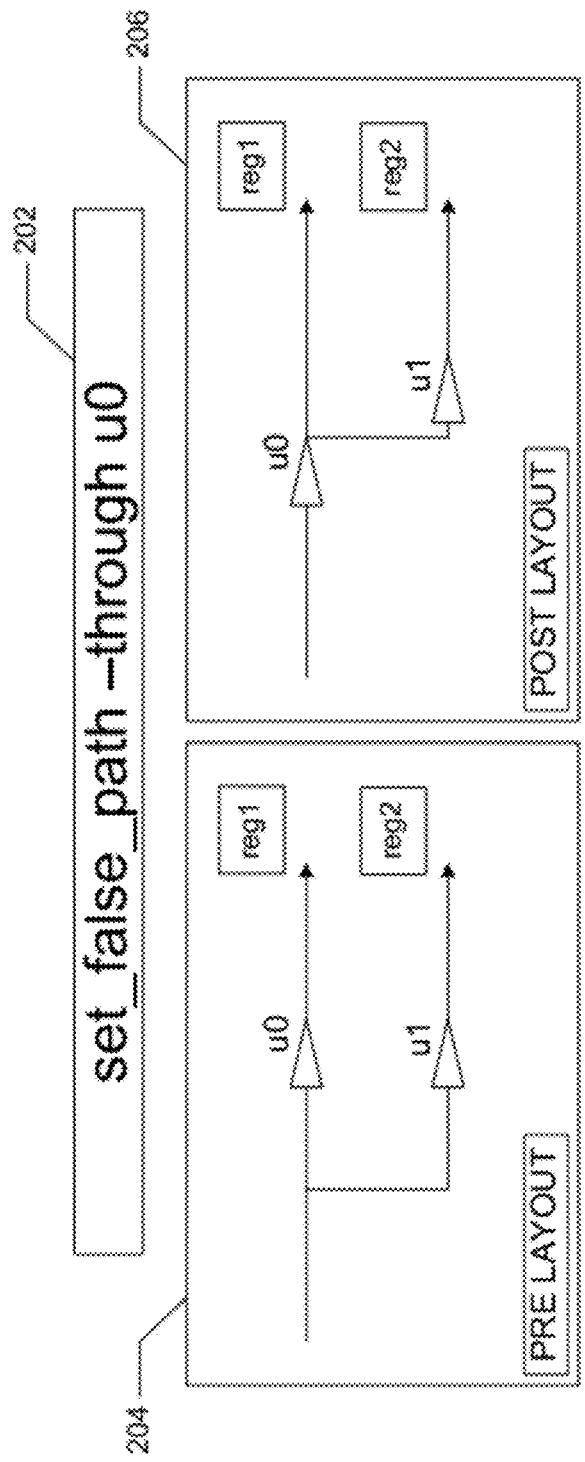
FIG. 2 shows a constraint problem related to a reference change.

FIG. 2 shows a constraint problem related to a reference change. Paths through cell u0 are designated as false paths (e.g., u0 is a redundant cell) 202 with reference to a pre-layout design 204 where a path is split into a first path though cell u0 to register reg1, and a second path through cell to register reg2. In this case the path through cell u0 is designated as a false path because u0 is a redundant cell. However, the post-layout design 206 is qualitatively different in that the path is split after cell u0 (not before as in the pre-layout design 204), so that the false-path designation 202 now covers the paths though cell u1. (Note that the words first and second are used here and elsewhere for labeling purposes only and are not intended to denote any specific spatial or temporal ordering. Furthermore, the labeling of a first element does not imply the presence a second element.)

Figure 3:
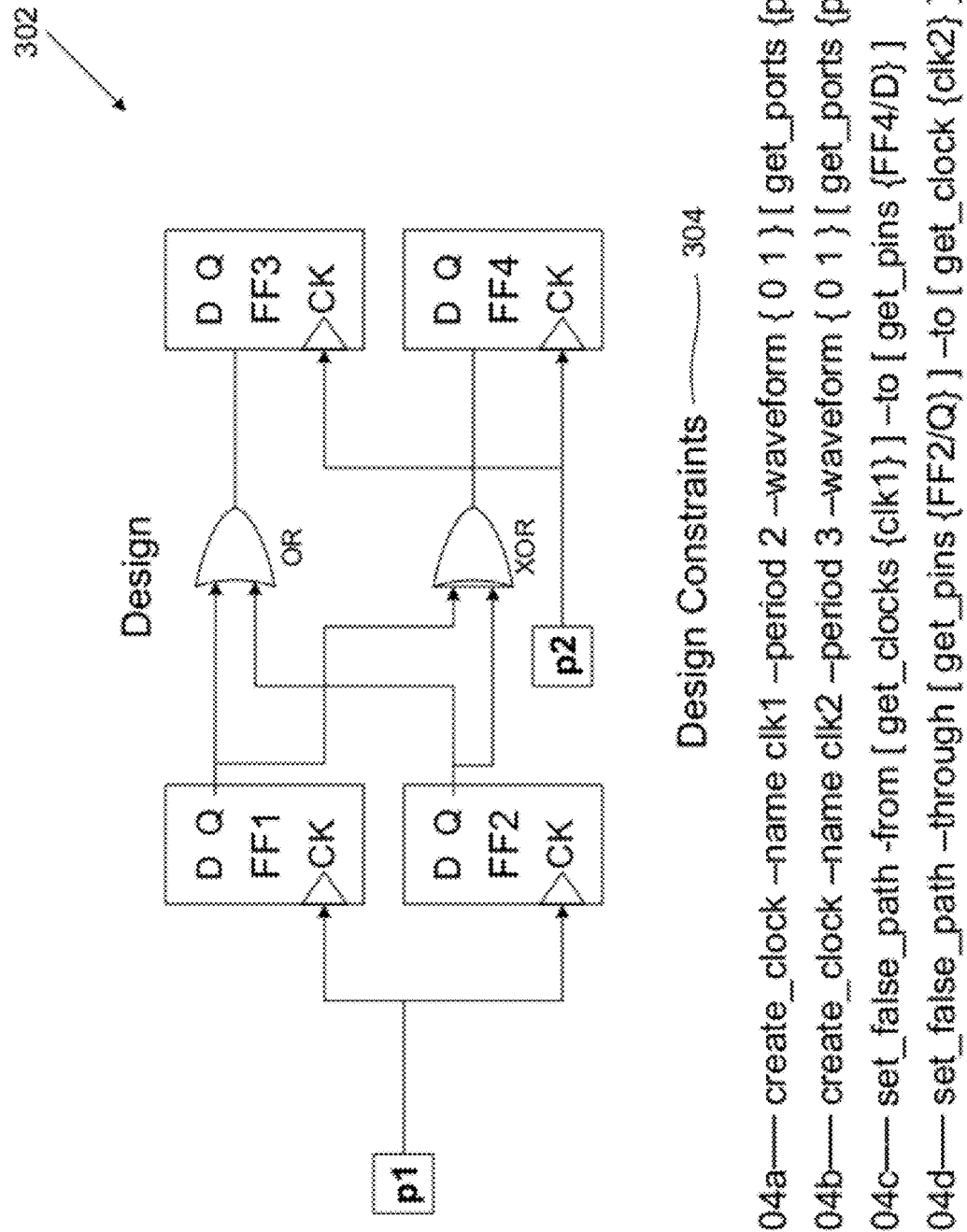
FIG. 3 shows a constrained circuit design for an embodiment of the present invention.

An important class of problems relates to the identification of partially overlapping constraints and fully overlapping constraints. For example, FIG. 3 shows a flattened design 302 that includes two pins p1 and p2 (e.g., for receiving clock inputs), four flip-flops FF1, FF2, FF3, and FF4, an OR gate and a XOR gate. Four design constraints 304 are shown including two for clock creation and two for designating false paths. The first design constraint 304a creates a clock clk1 at port p1 with a specified period and waveform, and the second design constraint 304b creates a clock clk2 at port p2 with a specified period and waveform. A first false path 304c is set from clock clk1 to the flip-flop port FF4/D, and a second false path 304d is set through flip-flop port FF2/Q to clock clk2.

Figure 4:
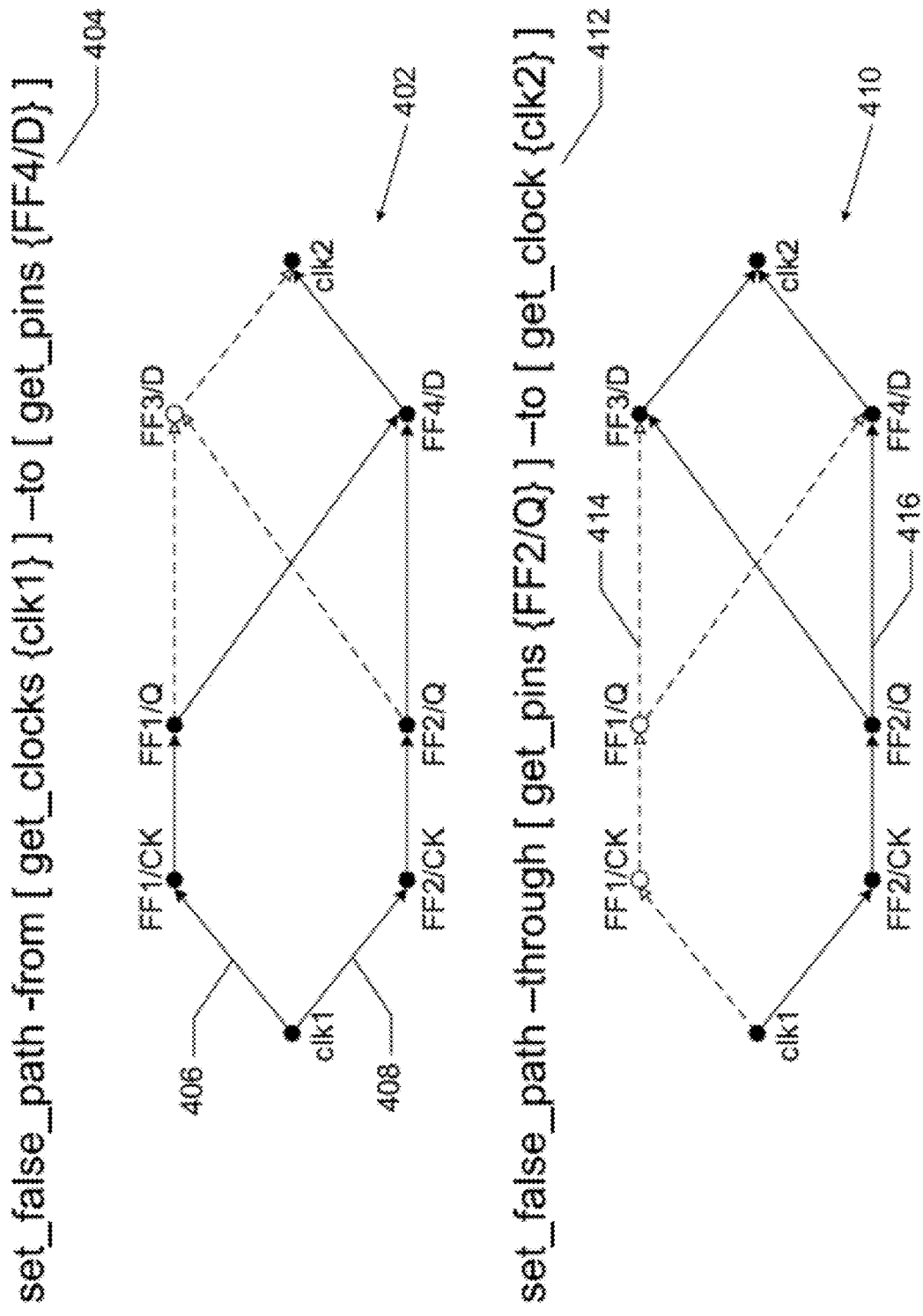
FIG. 4 shows timing graphs for the embodiment of FIG. 3.

FIG. 4 shows a comparison between the two false-path designations 304c, 304d for the design 302. A first timing graph 402 illustrates the first false path designation 404. This timing graph 402 includes nodes labeled for hardware elements of the design with directional edges that reflect the timing sequence (e.g., from clock clk1 as a launching clock to clock clk2 as a capturing clock). Paths corresponding to the false path designation are shown including a first path 406 given by <clk1, FF1/CK, FF1/Q, FF4/D, clk2> and a second path 408 given by <clk1, FF2/CK, FF2/Q, FF4/D, clk2>. A second timing graph 410 illustrates the second false path designation 412 including a first path 414 given by <clk1, FF2/CK, FF2/Q, FF3/D, clk2> and a second path 416 given by <clk1, FF2/CK, FF2/Q, FF4/D, clk2>. FIG. 4 illustrates a partial overlap between the two constraints 402, 412 since a path 408 of the first timing graph 402 matches (or coincides with) a path 416 of the second timing graph 410 while some paths 406, 414 do not have matching counterparts.

Figure 5:
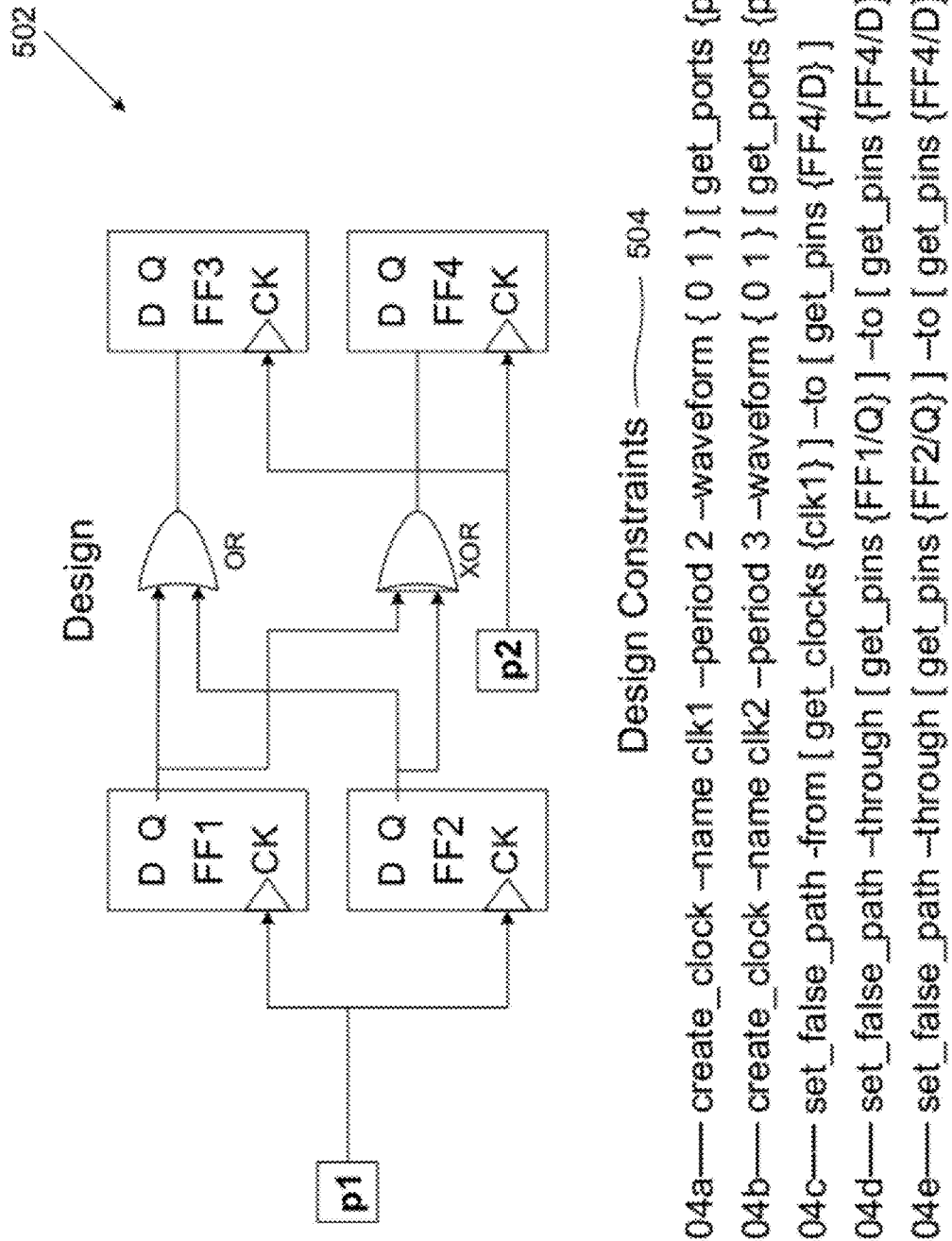
FIG. 5 shows a constrained circuit design for another embodiment of the present invention.

FIG. 5 shows the same flattened design 502 as in FIG. 3 with different constraints. Five design constraints 504 are shown including two for clock creation and three for designating false paths. As in FIG. 3, the first design constraint 504a creates a clock clk1 at port p1, and the second design constraint 504b creates a clock clk2 at port p2. A first false path 504c is set from clock clk1 to the flip-flop port FF4/D, a second false path 504d is set through flip-flop port FF1/Q to the flip-flop port FF4/D, and a third false path 504e is set through flip-flop port FF2/Q to the flip-flop port FF4/D.

Figure 6A:
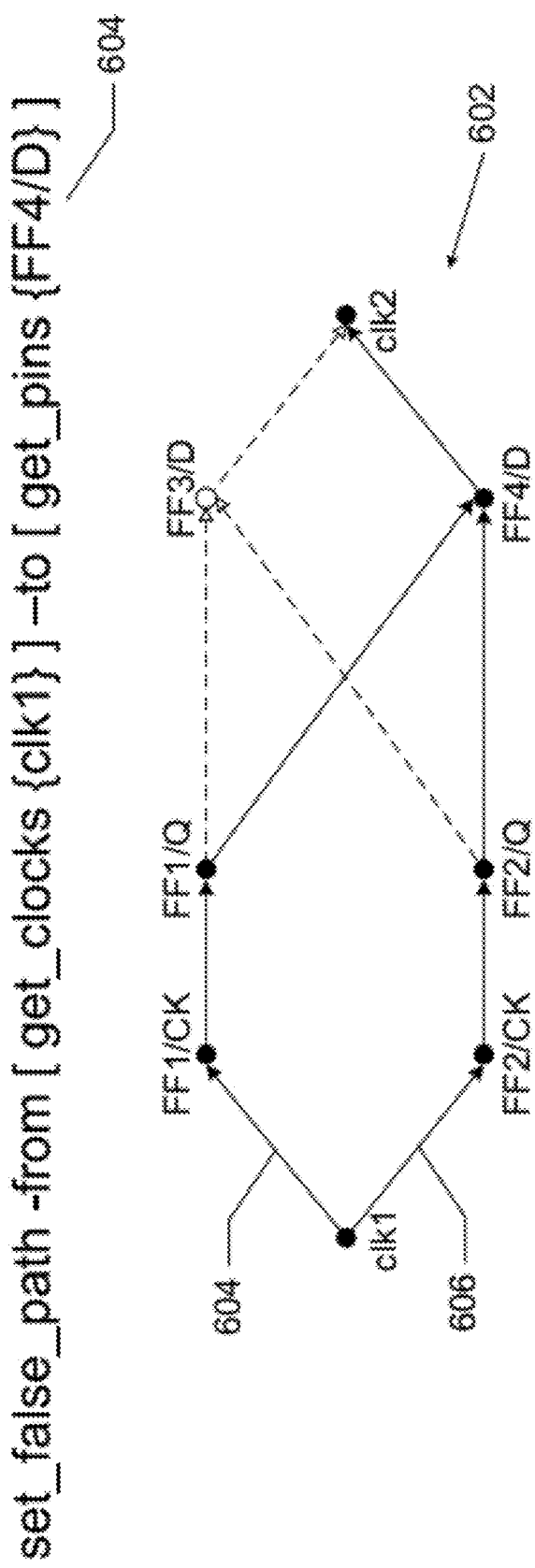
FIGS. 6A, 6B, and 6C show timing graphs for the embodiment of FIG. 5.
Figure 6B:
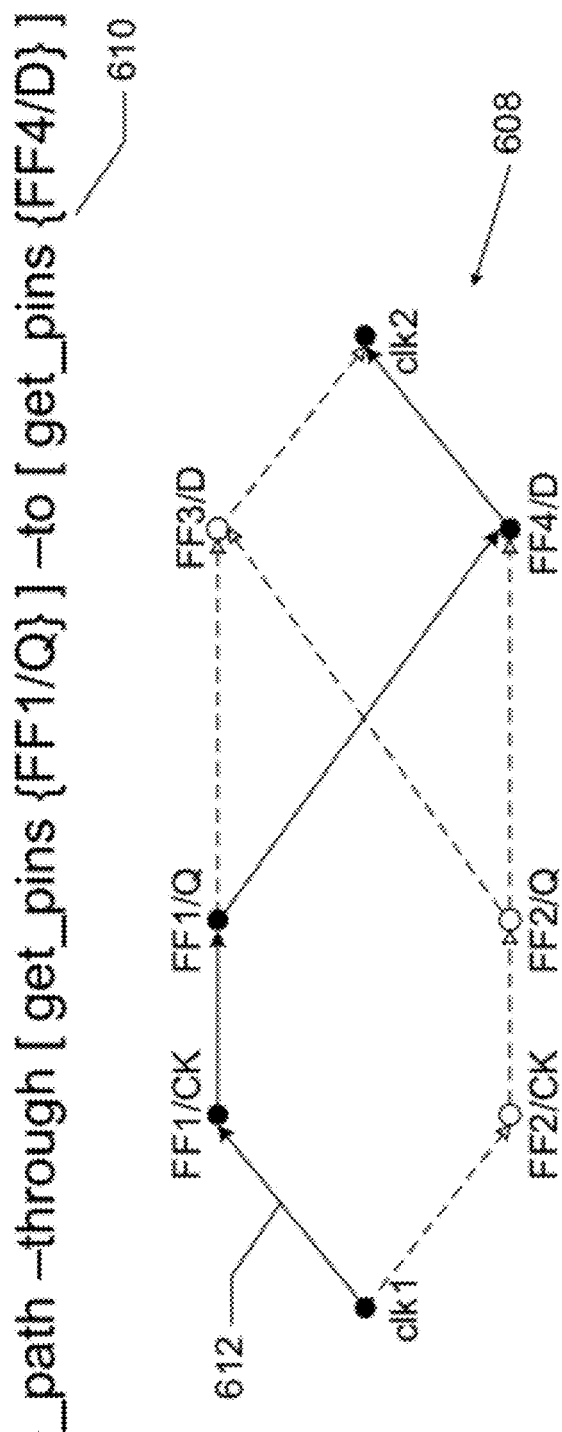
Figure 6C:
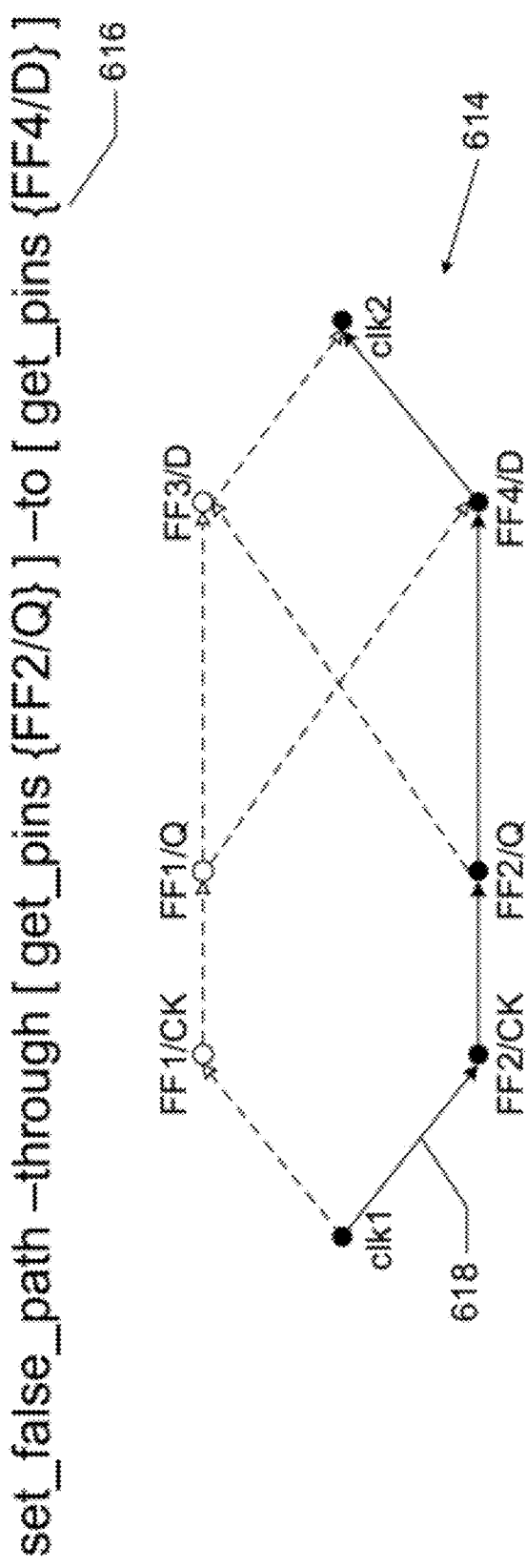

FIGS. 6A, 6B, and 6C show a comparison between the three false-path designations 504c, 504d, 504e for the design 502. A first timing graph 602 illustrates the first false path designation 604. This timing graph 602 includes nodes labeled for hardware elements of the design with directional edges that reflect the timing sequence (e.g., from clock clk1 as a launching clock to clock clk2 as a capturing clock). Paths corresponding to the false path designation are shown including a first path 604 given by <clk1, FF1/CK, FF1/Q, FF4/D, clk2> and a second path 606 given by <clk1, FF2/CK, FF2/Q, FF4/D, clk2>. A second timing graph 608 illustrates the second false path designation 610 including a path 612 given by <clk1, FF1/CK, FF1/Q, FF4/D, clk2>. A third timing graph 614 illustrates the second false path designation 616 including a path 618 given by <clk1, FF2/CK, FF2/Q, FF4/D, clk2>. FIGS. 6A, 6B, and 6C illustrate a full overlap between the first constraint 604 and the second and third constraints 610, 616 since the designated paths 604, 606 of the first timing graph 602 match (or coincide with) paths 612, 618 of the second and third timing graphs 608, 614.

The preceding examples are illustrative but highly simplified. For example, designs are typically much more complicated (e.g., with thousands or more interconnected design elements). And also constraints may include quantitative aspects (e.g., number of clock cycles) as well as topological aspects such as the false-path designations discussed above.

Figure 7:
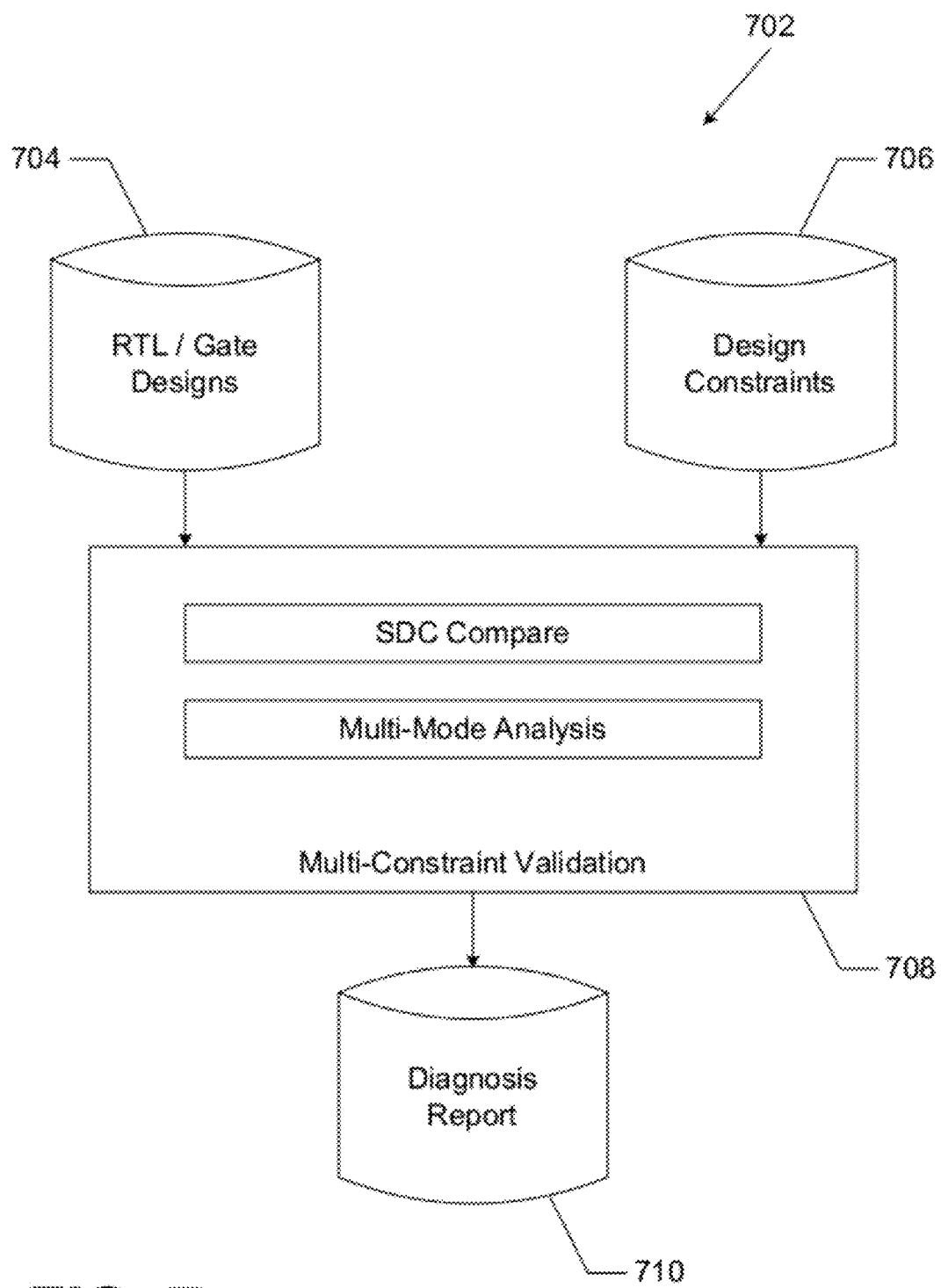
FIG. 7 shows a method of validating multiple constraints for circuit designs for another embodiment of the present invention.

FIG. 7 shows a method 702 of validating multiple constraints for circuit designs according to an embodiment of the present invention. In this example Designs 704 include RTL (Register Transfer Level) and gate-level designs. Constraints 706 include timing constraint specifications such clock timing definitions and timing exceptions for designated paths including false paths that are not active paths, multi-cycle paths that correspond to multiple clock cycles, maximum delays along paths, minimum delays along paths, and groups of paths that need to be optimized together. The multi-constraint validation process 708 includes options for SDC (Synopsis Design Constraints) and multi-mode analysis in as discussed below in greater detail. The output typically includes a diagnosis report with details that correspond to inconsistent, conflicting or missing constraints either with respect to a single design (e.g., including multiple modes) or across multiple designs (e.g., RTL/gate-level).

Figure 8:
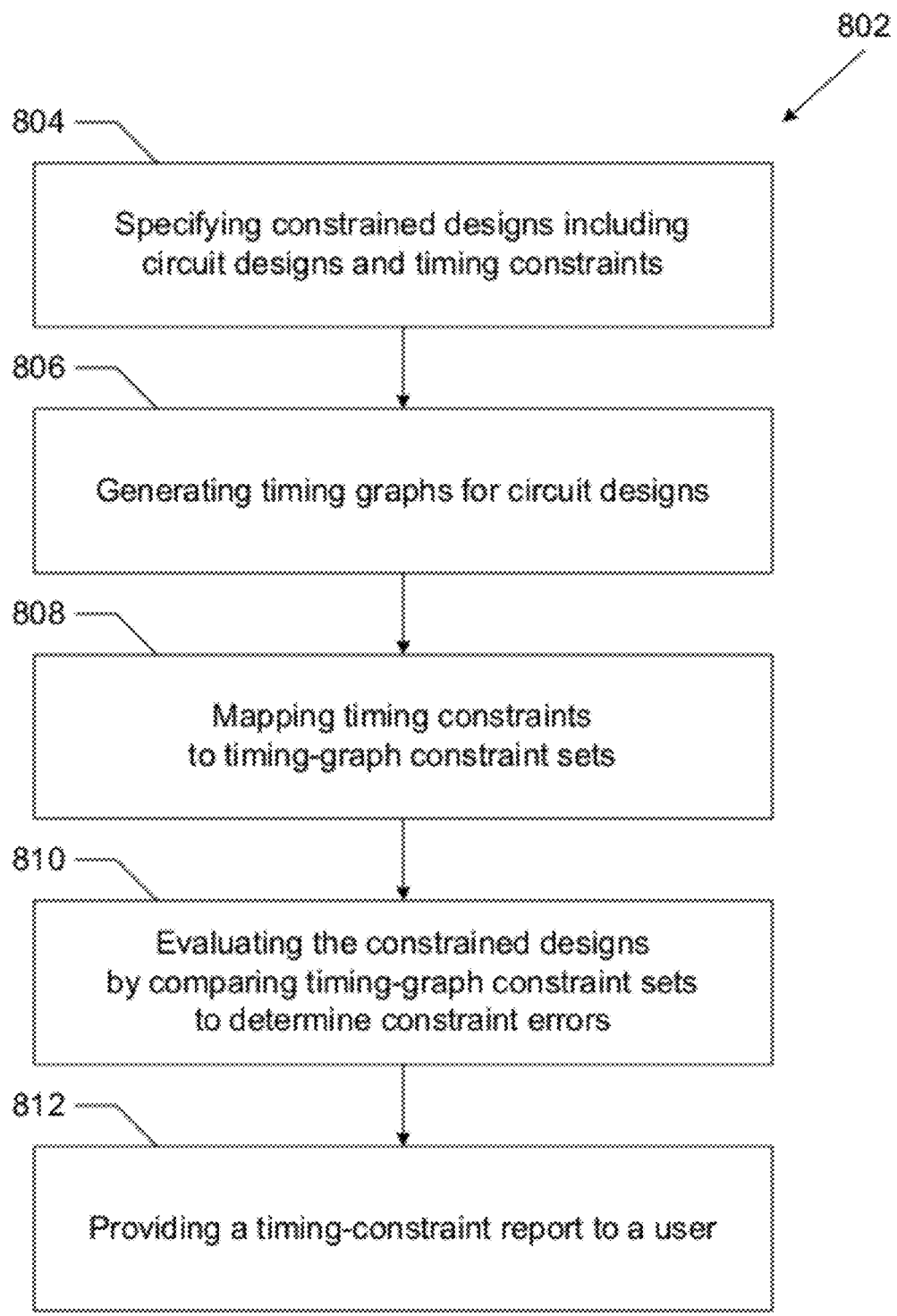
FIG. 8 shows a method of constraint validation for another embodiment of the present invention.

FIG. 8 shows further details for the constraint validation process 708 for an embodiment of the present invention. A method 802 of evaluating constrained designs for a circuit includes specifying constrained designs for the circuit 804. Typically each constrained design includes a circuit design that includes circuit elements and connections between circuit elements and additionally includes timing constraints for paths along the connections between circuit elements (e.g., as in the design 302 and constraints 304-304d in FIG. 3). Next a timing graph is generated for each circuit design, where each timing graph includes nodes corresponding to circuit elements and edges corresponding to connections between circuit elements 806 (e.g., as the graphs 402, 410 in FIG. 4). Next the timing constraints for each circuit design are mapped to a timing-graph constraint set for a corresponding timing graph 808 (e.g., as in the paths 406, 408, 414, 416 in FIG. 4). Next the constrained designs are evaluated by comparing the timing-graph constraint sets and determining the presence or absence of one or more paths with a constraint error that corresponds to an inconsistent, conflicting or missing constraint 810 (e.g., as in comparing the paths 406, 408, 414, 416 in FIG. 4). Finally a corresponding timing-constraint report can be provided to a user for evaluating constraint errors in the designs 812. Additional embodiments related to SDC comparisons and multi-mode designs are presented below.

FIG. 9 shows a single-design SDC comparison for the same flattened design 902 as in FIG. 3. Two sets of design constraints are considered including golden design constraints 904 (e.g., reference or nominal values) and revised design constraints 906 (e.g., values after modification or re-design). The golden constraints 904 include four design constraints including two for clock creation and two for designating false paths. The first design constraint 904a creates a clock clk1 at port p1 with a specified period and waveform, and the second design constraint 904b creates a clock clk2 at port p2 with a specified period and waveform. A first false path 904c is set from clock clk1 to the flip-flop port FF4/D, and a second false path 904d is set through flip-flop port FF2/Q to flip-flop port FF3/D. The revised constraints 906 include four design constraints including two for clock creation and two for designating false paths. The first design constraint 906a creates a clock c1 at port p1 with a specified period and waveform, and the second design constraint 906b creates a clock c2 at port p2 with a specified period and waveform. A first false path 906c is set through flip-flop port FF1/Q to flip-flop port FF4/D, and a second false path 906d is set through flip-flop port FF2/Q to flip-flop port FF4/D.

Figure 10:
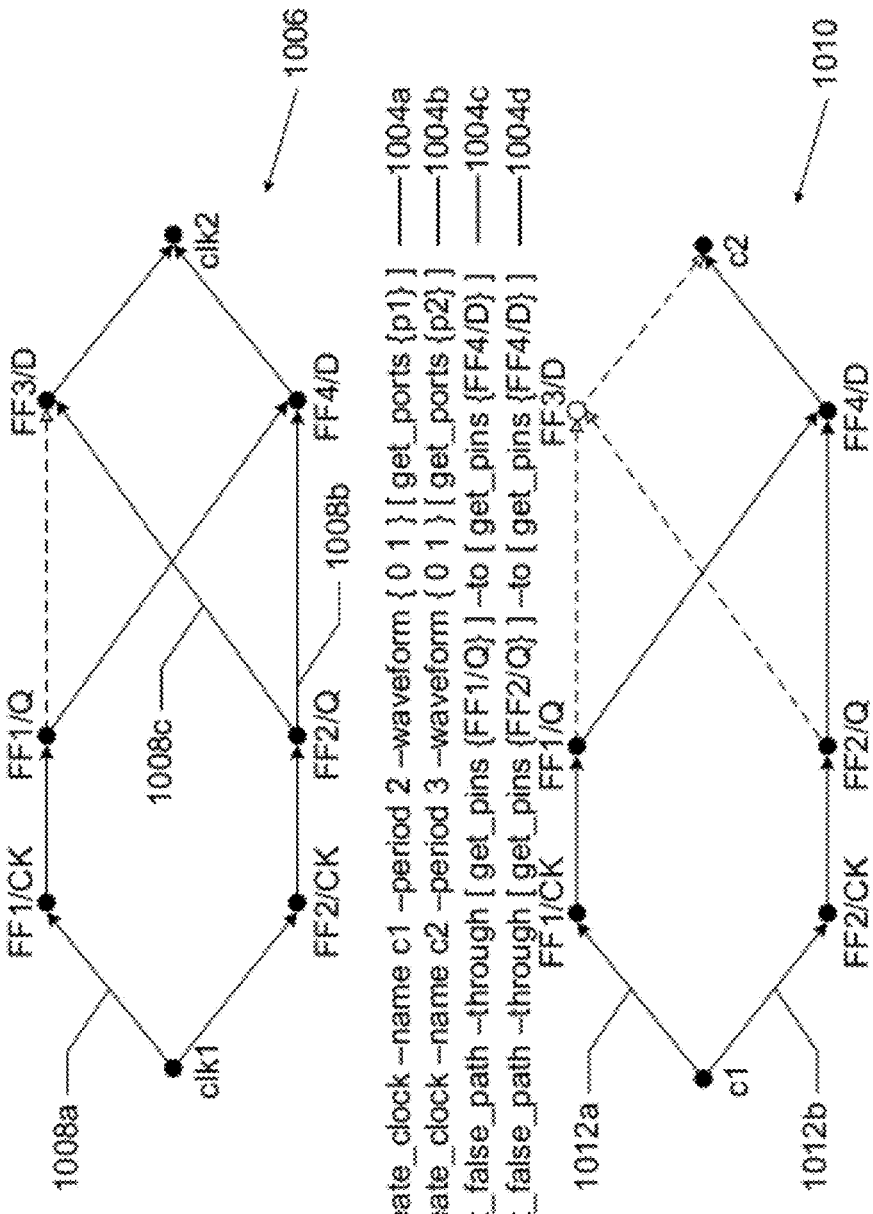
FIG. 10 shows timing graphs for the embodiment of FIG. 9.

FIG. 10 shows a comparison between the golden design constraints 1002 and the revised design constraints 1004. The design with the golden constraints 1002 is used to generate a timing graph 1006, where clock ck1 is identified on the left (e.g., as launching clock) and clock ck2 is identified on the right (e.g., as a capturing clock). The first false-path command 1002c is mapped to a first path 1008a given by <clk1, FF1/CK, FF1/Q, FF4/D, clk2> and a second path 1008b given by <clk1, FF2/CK, FF2/Q, FF4/D, clk2>. The second false-path command 1002d is mapped to a third path 1008c given by <clk1, FF2/CK, FF2/Q, FF3/D, clk2>. The design with the revised constraints 1004 is used to generate a timing graph 1010, where clock c1 is identified on the left (e.g., as launching clock) and clock c2 is identified on the right (e.g., as a capturing clock). The first false-path command 1004c is mapped to a first path 1012a given by <c1, FF1/CK, FF1/Q, FF4/D, c2>. The second false-path command 1004d is mapped to a second path 1012b given by <c1, FF2/CK, FF2/Q, FF4/D, c2>.

In order to compare the constraints 1002, 1004, which have been associated with the timing graphs 1006, 1010, the nodes of the graphs are mapped to (or identified with) one another. In this case clock clk1 in first timing graph 1006 is identified with clock c1 in the second timing graph 1010, and clock clk2 in first timing graph 1006 is identified with clock c2 in the second timing graph 1010. Other nodes are directly identified. Although the identifications between nodes of the timing graphs 1006, 1010 are clear in this case, more general cases can be handled by testing possible identifications until the correct one is found.

Once the nodes have been identified the constraints can be compared by comparing corresponding paths on the timing graphs 1006, 1010. For example, one can ascertain whether constraints in the golden design 1002 are covered by revised design 1004. In this case, the first path 1008a for the first false-path command 1002c in the golden design corresponds to the path 1012a for the first false-path command 1004c in the revised design, and the second path 1008b for the first false-path command 1002c in the golden design corresponds to the path 1012b for the second false-path command 1004c in the revised design. Thus, the first false-path command 1002c in the golden design is covered by the revised design. On the other hand, the path 1008c for the second false path command 1002d in the golden design is not covered in the revised design and this deficit can be reported to user who may wish to augment the revised design accordingly.

Figure 11:
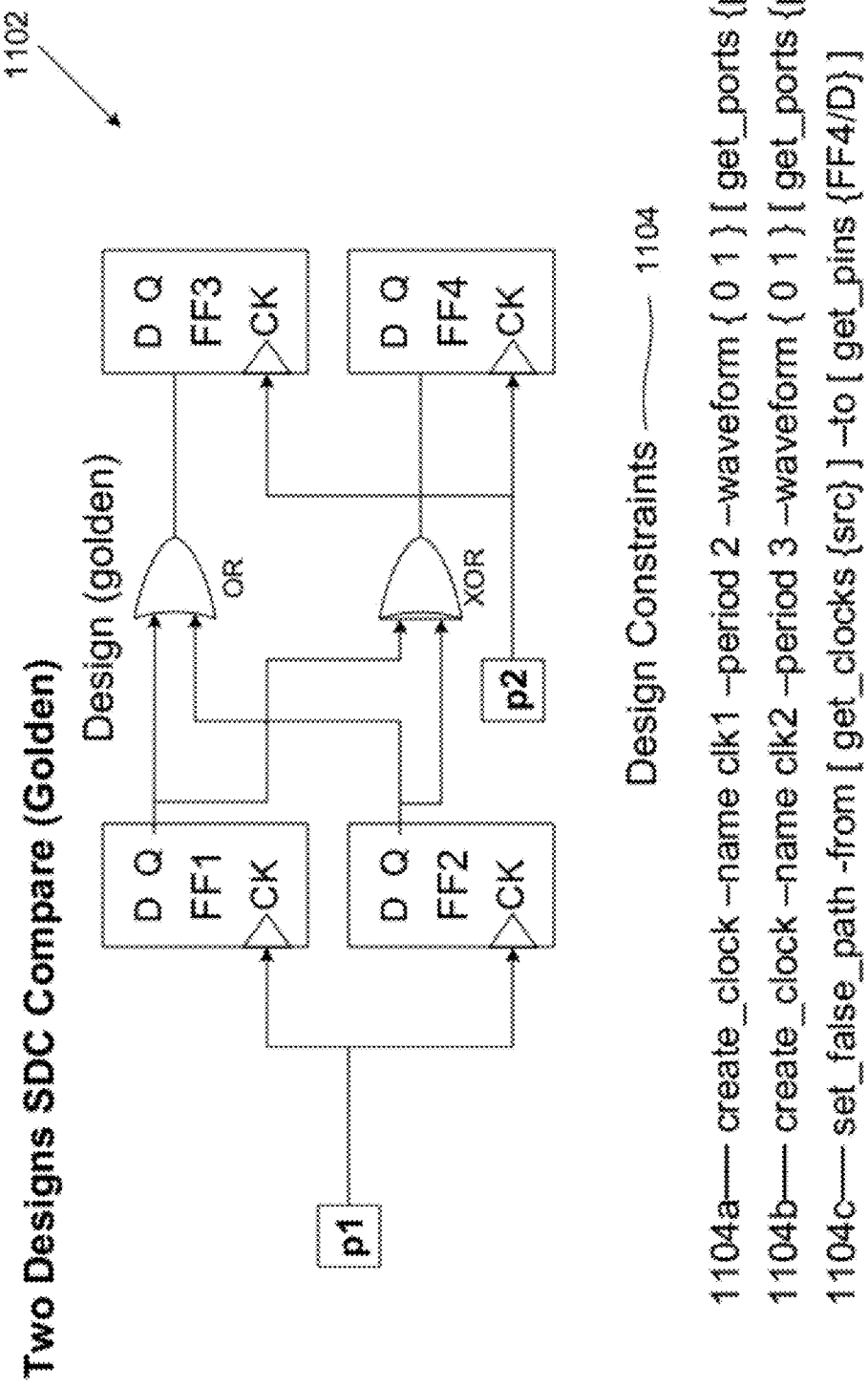
FIG. 11 shows a constrained circuit design, designated as a golden (i.e., reference) design, for another embodiment of the present invention.
Figure 12:
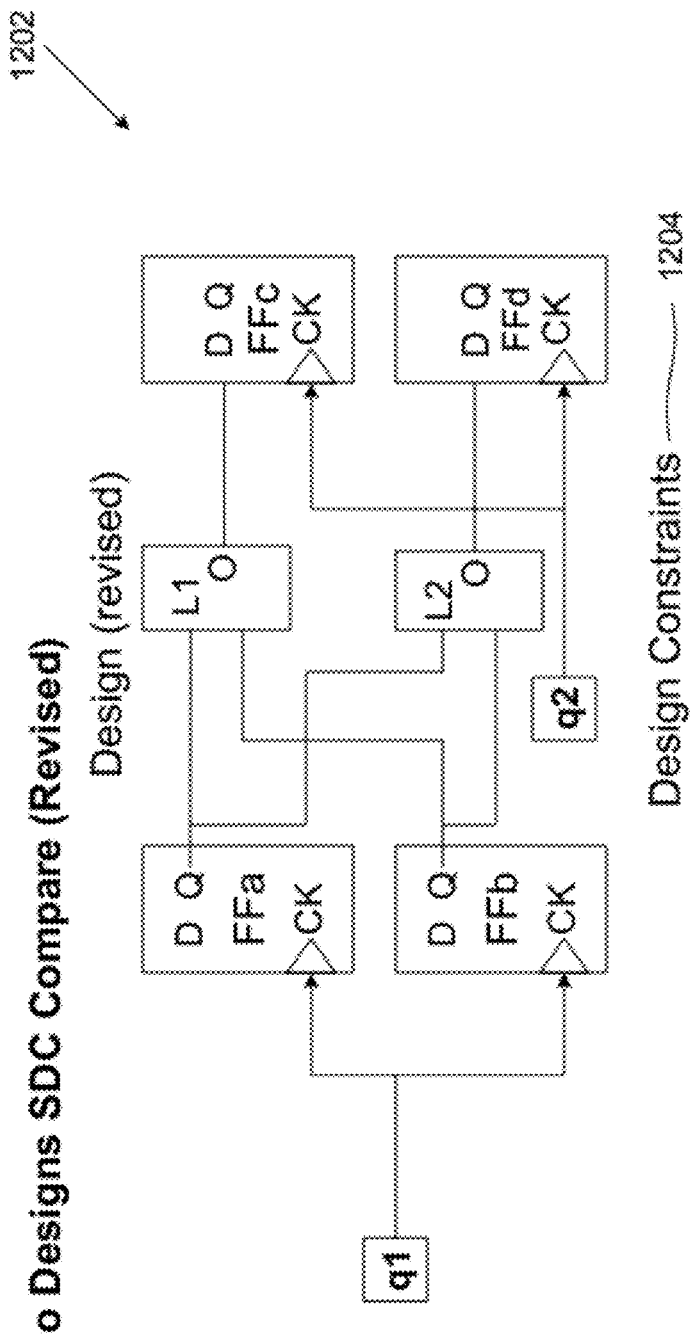
FIG. 12 shows a constrained circuit design, designated as a revised design, for comparison with the golden design in the embodiment of FIG. 11.

In some contexts, comparisons must be made between two SDC designs with different formulations (e.g., RTL and gate level). In this case the nodal comparisons between timing graphs may not be one-to-one. FIG. 11 shows a golden design including the same flattened design 1102 as in FIG. 3. The three golden design constraints 1104 include two constraints for clock creation and one constraint for designating false paths. As in FIG. 3, the first design constraint 1104a creates a clock clk1 at port p1, and the second design constraint 1104b creates a clock clk2 at port p2. A false path 1104c is set from a clock to the flip-flop port FF4/D. FIG. 12 shows a revised design including a flattened design 1102 that is topologically similar to the golden design 1102. Pins p1 and p2 have been replaced by pins q1 and q2, flip-flops FF1, FF2, FF3, and FF4 have been replaced by flip-flops FFa, FFb, FFc, and FFd, and logic gates OR and XOR have been replaced by logic elements L1 and L2. The four revised design constraints 1204 include two constraints for clock creation and two constraints for designating false paths.

FIG. 13 shows the graphical comparison between the golden and revised constraints. The constrained golden design is represented by a timing graph 1302 that captures the topological structure of the design 1102. The constraints 1304 are also shown. As in FIG. 3, the first design constraint 1304a creates a clock clk1 at port p1, and the second design constraint 1304b creates a clock clk2 at port p2. Paths corresponding to the false path designation 1304c are shown including a first path 1306a given by <clk1, FF1/CK, FF1/Q, FF4/D, clk2> and a second path 1306b given by <clk1, FF2/CK, FF2/Q, FF4/D, clk2>. The constrained revised design is represented by a timing graph 1308 that captures the topological structure of the design 1202. The constraints 1310 are also shown. As in FIG. 3, the first design constraint 1310a creates a clock c1 at port q1, and the second design constraint 1310b creates a clock c2 at port q2. The first false path designation 1310c corresponds to at path 1312a given by <c1, FFa/CK, FFa/Q, L2/O, FFd/D, c2>, and the second false path designation 1310d corresponds to at path 1312b given by <c1, FFb/CK, FFb/Q, L2/O, FFd/D, c2>.

The nodes of the golden timing graph 1302 are easily identified with the nodes of the revised timing graph 1308 (e.g., clk1 with c1, clk2 with c2, FF1 with FFa, FF2 with FFb, FF3 with FFc, FF4 with FFd). However, node L2/O in the revised design 1308 does not identify with a node in the golden design 1302. In this case, the XOR gate in the golden design 1302 was replaced by a logical element L2 in the revised design 1308. However, one can still compare the two sets of design constraints and ascertain whether constraints in the golden design 1302 are covered by revised design 1308. In this case clocks clk1 and clk2 of the golden design 1302 identify with clocks c1 and c2 of the revised design 1308 since the nodes identify in the graphs and the quantitative arguments match. Thus, the two clock-creating commands 1304a, 1304b in the golden design are covered by revised design. The first path 1306a for the false-path command 1304c in the golden design corresponds to the path 1312a for the first false-path command 1310c in the revised design, and the second path 1306b for the false-path command 1304c in the golden design corresponds to the path 1312b for the second false-path command 1310d in the revised design. Thus, the first false-path command 1002c in the golden design is covered by the revised design. Therefore, the golden design constraints 1304 are fully covered by the revised design constraints 1310.

Figure 14:
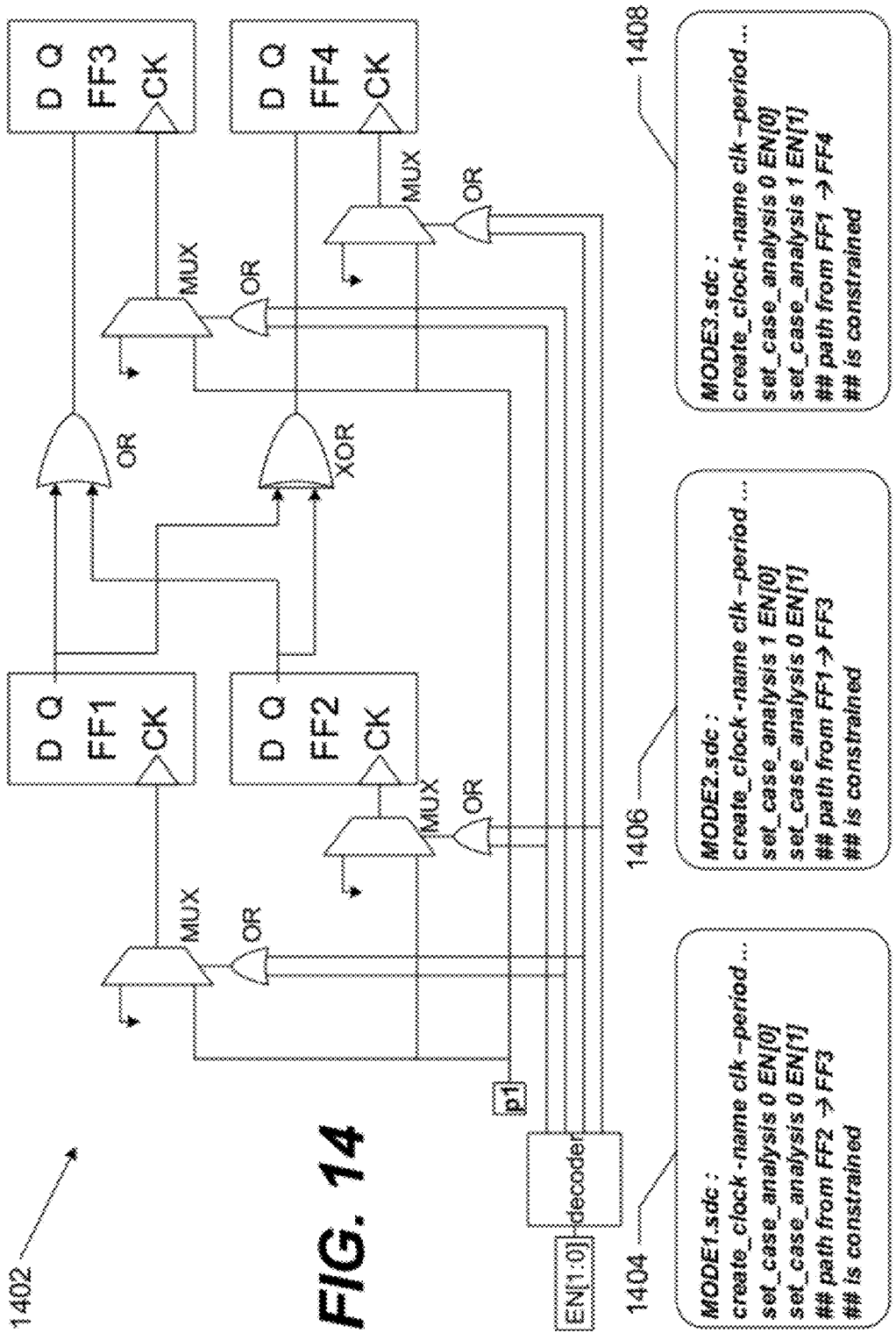
FIG. 14 shows a constrained multi-mode circuit design for another embodiment of the present invention.

In the context of multi-mode systems, each set of timing constraints may correspond to a different mode of operation of the system (e.g., active, low-power, sleep, etc.). The totality of the constraints (e.g., union of the constraint sets) must be checked for completeness and consistency so that the overall design satisfies the requirements for each operational mode. FIG. 14 shows a flattened design 1402 for a circuit that is constrained for operation in three modes 1404, 1406, 1408. In the lower left of the design 1402, a two-bit variable EN[1:0] is used to set the mode through a decoder, which has four outputs for the four possible values of EN[1:0]. A pin p1 is used for clock inputs. The circuit includes four muxes, each with an OR gate at the selection input, four flip-flops FF1, FF2, FF3, and FF4, plus an OR gate and a XOR gate between the flip-flops.

Three modes 1404, 1406, 1408 are defined based on three of the four possible choices for EN[1:0]. In the first mode 1404, which corresponds to EN[0]=0, EN[1]=0, constraints include a clock definition for the pin p1 and a constraint for the path from FF2 to FF3 (e.g., false path, minimum delay, maximum delay, multicycle). In the second mode 1406, which corresponds to EN[0]=1, EN[1]=0, constraints include a clock definition for the pin p1 and a constraint for the path from FF1 to FF3. In the third mode 1408, which corresponds to EN[0]=0, EN[1]=1, constraints include a clock definition for the pin p1 and a constraint for the path from FF1 to FF4.

Figure 15:
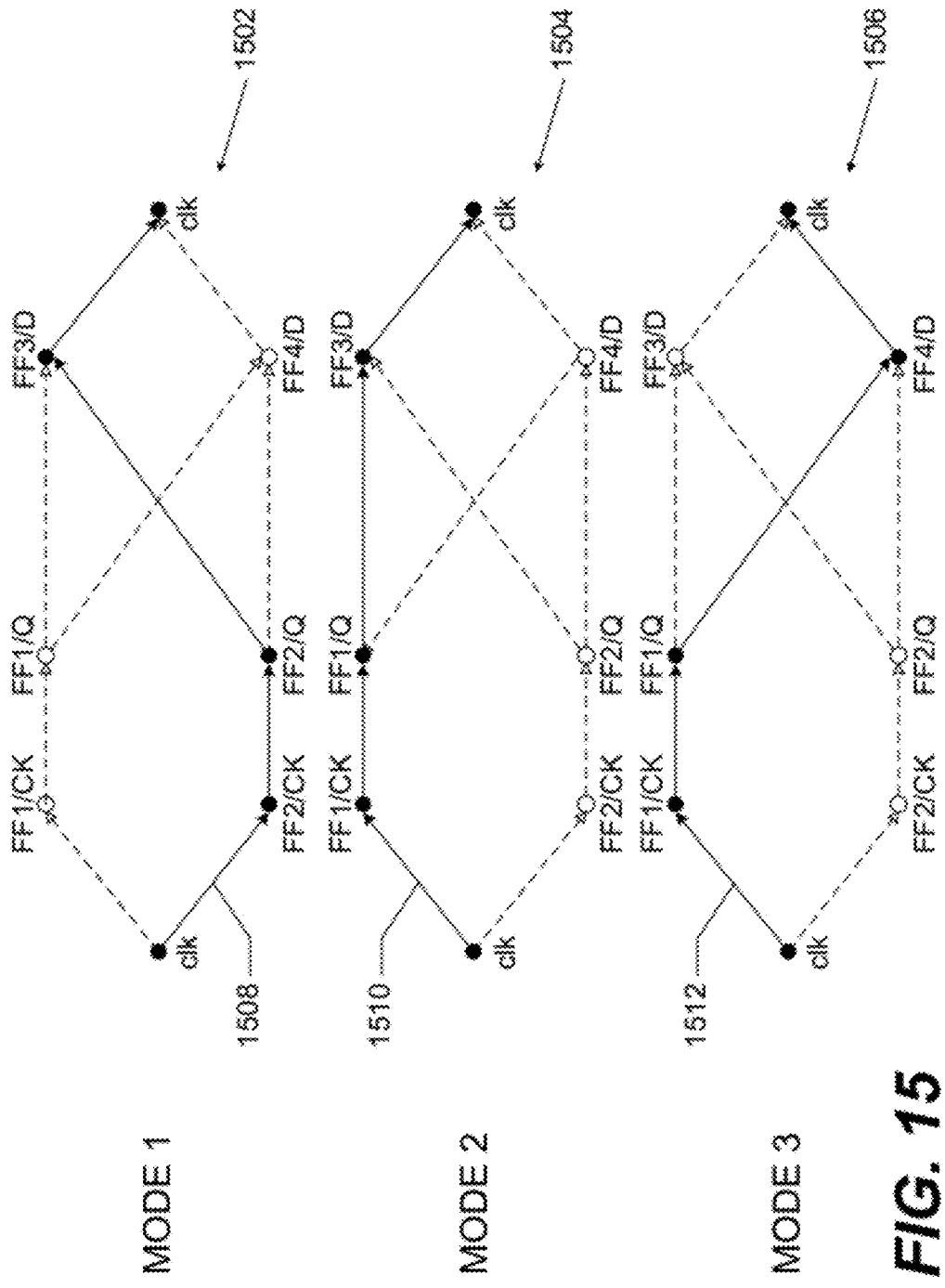
FIG. 15 shows timing graphs for the embodiment of FIG. 14.

FIG. 15 shows timing graphs for each mode. The first timing graph 1502, which corresponds to the first mode 1404, includes a path 1508 given by <clk, FF2/CK, FF2/Q, FF3/D, clk>. The second timing graph 1504, which corresponds to the second mode 1406, includes a path 1510 given by <clk, FF1/CK, FF1/Q, FF3/D, clk>. The third timing graph 1506, which corresponds to the second mode 1408, includes a path 1512 given by <clk, FF1/CK, FF1/Q, FF4/D, clk>.

Figure 16:
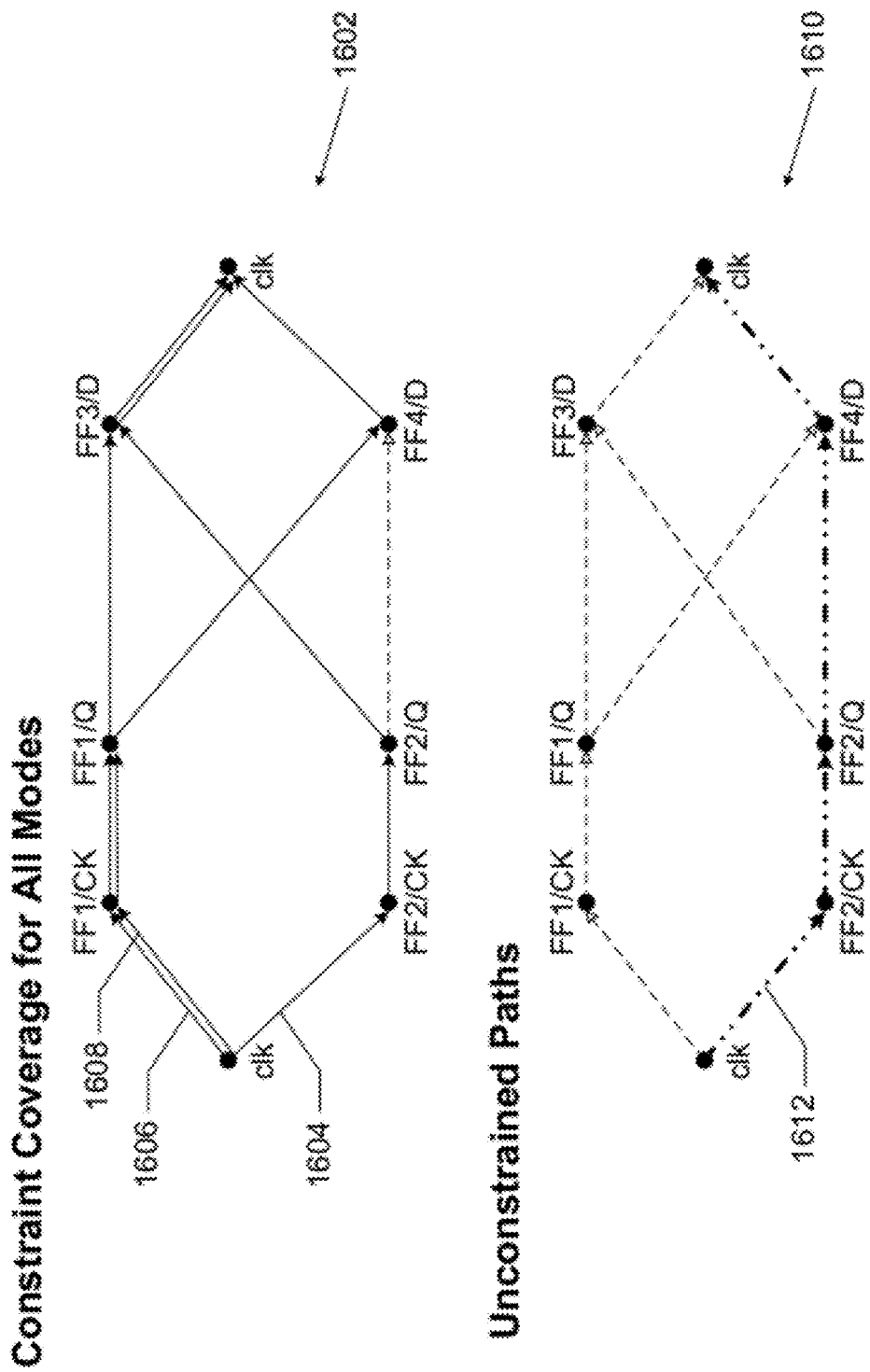
FIG. 16 shows comparisons between the timing graphs of FIG. 15 for the embodiment of FIG. 14.

FIG. 16 shows a timing graph 1602 that shows a superposition of these constrained paths where the first path 1604 corresponds to the path 1508 for mode 1, the second path 1606 corresponds to the path 1510 for mode 2, and the third path 1608 corresponds to the path 1512 for mode 3. Another timing graph 1610 represents the unconstrained paths (i.e., the complement of the paths shown in the first timing graph 1602). In this case an unconstrained path 1612 is given by <clk, FF2/CK, FF2/Q, FF4/D, clk>. In this case, the unconstrained path 1612 is related to a "missing mode" in the constraint set (e.g., a fourth mode corresponding to EN[0]=1, EN[1]=1), a defect that may have been overlooked by the circuit designer.

Figure 17:
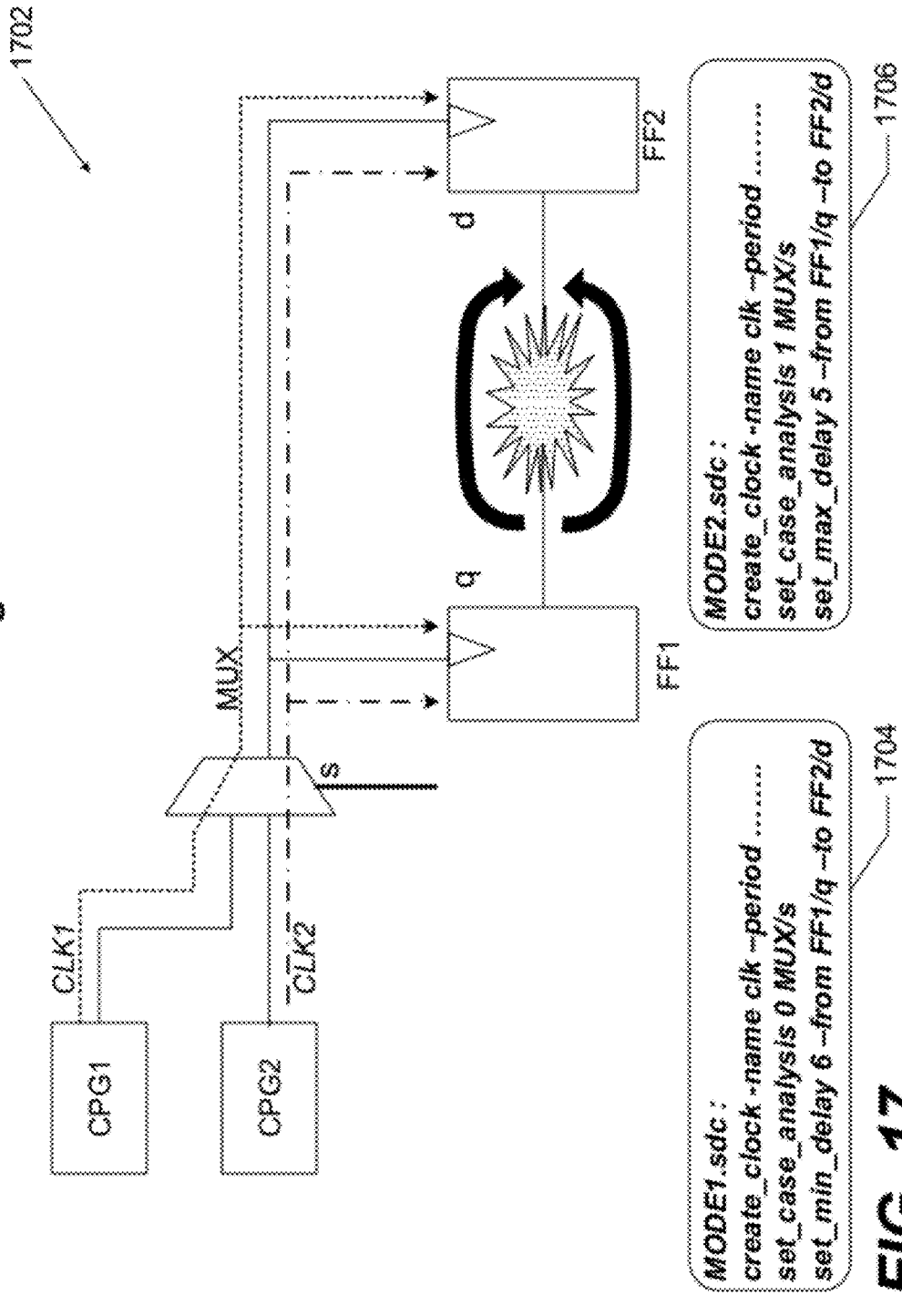
FIG. 17 shows a constrained multi-mode circuit design for another embodiment of the present invention.

Other problems in multimode systems include conflicting or inconsistent constraints across the modes (e.g., within the union of modal constraints). FIG. 17 shows a design 1702 with two clocks, CPG1 with clock signal CLK1, and CPG2 with clock signal CLK2, and a MUX (with a selector s) that is included between two flip-flops FF1, FF2. In a first mode 1704, designated by setting selector s=0, constraints include clock definition(s) and a minimum delay of 6 clock cycles for the path from FF1/q to FF2/d. In a second mode 1706, designated by setting selector s=1, constraints include clock definition(s) and a maximum delay of 5 clock cycles for the path from FF1/q to FF2/d. These constraints conflict since the minimum delay is greater than the maximum delay, and a corresponding report to the circuit designer may lead to a change in the design to eliminate this conflict (e.g., imposing a maximum delay of 5 clock cycles for both modes).

Figure 18:
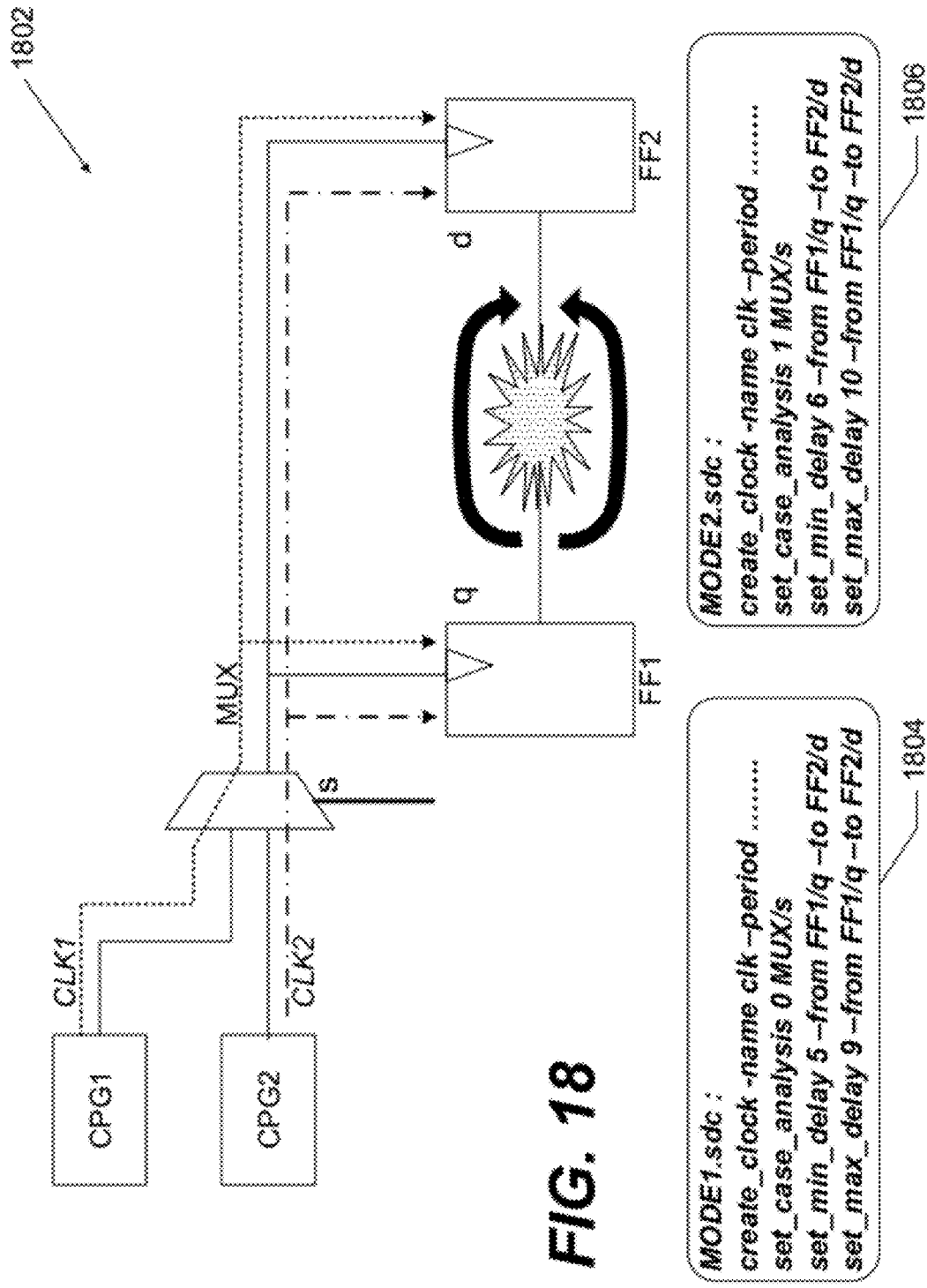
FIG. 18 shows a constrained multi-mode circuit design for another embodiment of the present invention.

FIG. 18 shows the same design 1802 with two clocks, CPG1 with clock signal CLK1, and CPG2 with clock signal CLK2 and a MUX (with a selector s) that is included between two flip-flops FF1, FF2. In a first mode 1804, designated by setting selector s=0, constraints include clock definition(s), plus a minimum delay of 5 clock cycles and a maximum delay of 9 clock cycles for the path from FF1/q to FF2/d. In a second mode 1806, designated by setting selector s=1, constraints include clock definition(s) plus a minimum delay of 6 clock cycles and a maximum delay of 10 clock cycles for the same path from FF1/q to FF2/d. These constraints for minimum delays and maximum delays are inconsistent since they impose different values for constraining the same paths. A corresponding report to the circuit designer may lead to a change in the design to eliminate this inconsistency (e.g., imposing a minimum delay of 6 clock cycles and a maximum delay of 9 clock cycles for both modes).

Although the examples described above are simple enough to illustrate with small timing graphs, those skilled in the art will appreciate that more complex designs and constraints can be similarly handled, with millions of logic gate equivalents and millions of edges and vertices. The application of this invention is not limited to specific implementations of algorithms or data structures. Some exemplary implementations for generating timing graphs for designs and mapping timing constraints to timing graphs are described, for example, in: K. Belkhale and A. Suess, "Timing Analysis with Known False Sub Graphs", ICCAD, 1995; E. Goldberg and A. Saldanha, "Timing Analysis with Implicitly Specified False Paths", International Conference on VLSI Design, 2000; H. Chen, B. Lu and D. Du, "Static Timing Analysis with False Paths", ICCD, 2000; H. Higuchi, "An Implication-based Method to Detect Multi-Cycle Paths in Large Sequential Circuits", DAC 2002; and Cho W. Moon, "Timing Model Extraction of Hierarchical Blocks by Graph Reduction", DAC 2002. Each of these references is incorporated herein by reference in its entirety.

Identifying nodes between two timing graphs and comparing constraints between two timing graphs relate to a body of work known as graph matching. Some exemplary graph matching algorithms and heuristics are described, for example, in D. Conte, P. Foggia, C. Sansone and M. Vento, "Thirty Years Of Graph Matching In Pattern Recognition", International Journal of Pattern Recognition and Artificial Intelligence, Vol. 18, No. 3 (2004), which is incorporated herein by reference in its entirety.

Additional embodiments relate to an apparatus for carrying out any one of the above-described methods, where the apparatus includes a computer for executing computer instructions related to the method. In this context the computer may be a general-purpose computer including, for example, a processor, memory, storage, and input/output devices (e.g., keyboard, display, disk drive, Internet connection, etc.). However, the computer may include circuitry or other specialized hardware for carrying out some or all aspects of the method. In some operational settings, the apparatus or computer may be configured as a system that includes one or more units, each of which is configured to carry out some aspects of the method either in software, in hardware or in some combination thereof. For example, the system may be configured as part of a computer network that includes the Internet. At least some values for the results of the method can be saved for later use in a computer-readable medium, including memory units (e.g., RAM (Random Access Memory), ROM (Read Only Memory)) and storage devices (e.g., hard-disk systems, optical storage systems).

Additional embodiments also relate to a computer-readable medium that stores (e.g., tangibly embodies) a computer program for carrying out any one of the above-described methods by means of a computer. The computer program may be written, for example, in a general-purpose programming language (e.g., C, C++) or some specialized application-specific language. The computer program may be stored as an encoded file in some useful format (e.g., binary, ASCII). In some contexts, a computer-readable medium may be alternatively described as a computer-useable medium, a computer-storage medium, or a computer-program medium. Depending on the on the operational setting, specified values for the above-described methods may correspond to input files for the computer program or computer.

Figure 19:
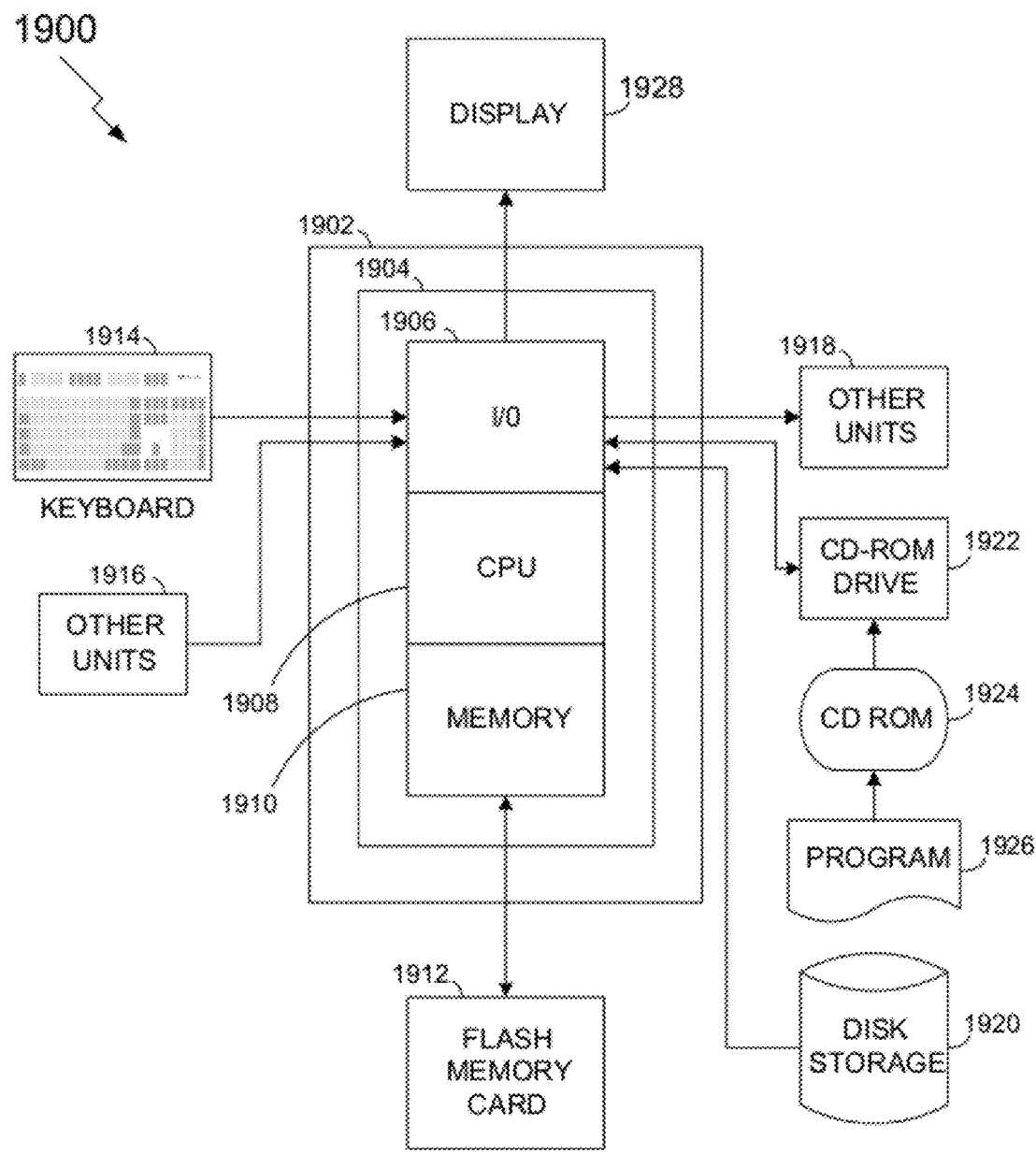
FIG. 19 shows a conventional general-purpose computer.

As described above, certain embodiments of the present invention can be implemented using standard computers and networks including the Internet. FIG. 19 shows a conventional general purpose computer 1900 with a number of standard components. The main system 1902 includes a motherboard 1904 having an input/output (I/O) section 1906, one or more central processing units (CPU) 1908, and a memory section 1910, which may have a flash memory card 1912 related to it. The I/O section 1906 is connected to a display 1928, a keyboard 1914, other similar general-purpose computer units 1916, 1918, a disk storage unit 1920 and a CD-ROM drive unit 1922. The CD-ROM drive unit 1922 can read a CD-ROM medium 1924 which typically contains programs 1926 and other data.

Figure 20:
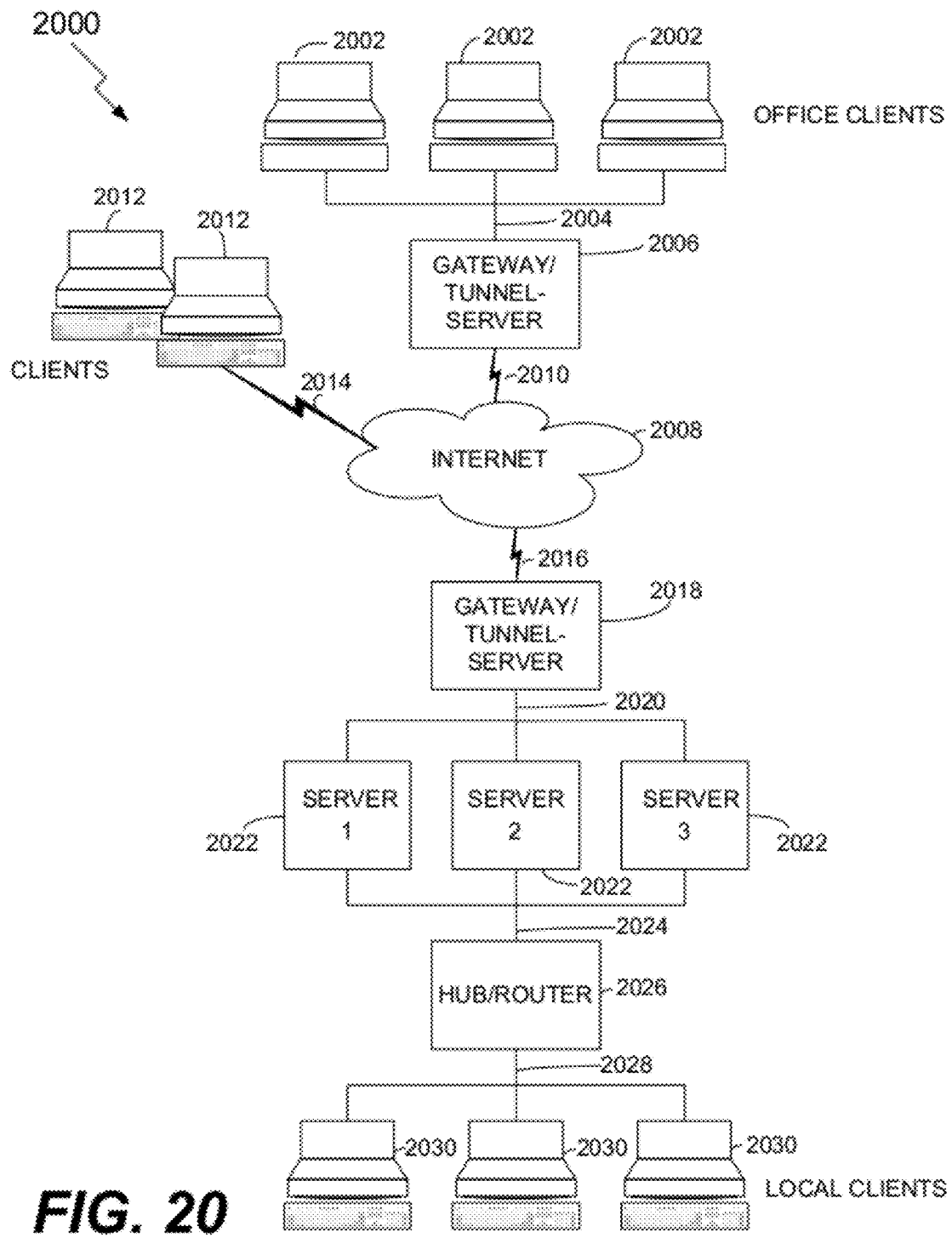
FIG. 20 shows a conventional Internet network configuration.

FIG. 20 shows a conventional Internet network configuration 2000, where a number of office client machines 2002, possibly in a branch office of an enterprise, are shown connected 2004 to a gateway/tunnel-server 2006 which is itself connected to the Internet 2008 via some internet service provider (ISP) connection 2010. Also shown are other possible clients 2012 similarly connected to the Internet 2008 via an ISP connection 2014. An additional client configuration is shown for local clients 2030 (e.g., in a home office). An ISP connection 2016 connects the Internet 2008 to a gateway/tunnel-server 2018 that is connected 2020 to various enterprise application servers 2022. These servers 2022 are connected 2024 to a hub/router 2026 that is connected 2028 to various local clients 2030.

Although only certain exemplary embodiments of this invention have been described in detail above, those skilled in the art will readily appreciate that many modifications are possible in the exemplary embodiments without materially departing from the novel teachings and advantages of this invention. For example, aspects of embodiments disclosed above can be combined in other combinations to form additional embodiments. Accordingly, all such modifications are intended to be included within the scope of this invention.

What is claimed is:

1. A method of evaluating constrained circuit designs, comprising:
    specifying a plurality of constrained designs, wherein each constrained design includes a circuit design that includes circuit elements and connections between circuit elements, and each constrained design further includes timing constraints for paths along the connections between circuit elements, the timing constraints including one or more timing exceptions including false paths that are not active paths, multi-cycle paths that correspond to multiple clock cycles, maximum delays along paths, or minimum delays along paths;
    generating a timing graph for each circuit design, wherein each timing graph includes nodes corresponding to circuit elements and edges corresponding to connections between circuit elements;
    mapping the timing constraints for each circuit design to a timing-graph constraint set for a corresponding timing graph;
    using a computer to evaluate the constrained designs by comparing the timing-graph constraint sets and determining a presence or absence of one or more paths with a constraint error that corresponds to an inconsistent, conflicting or missing constraint; and
    providing a timing-constraint report to a user, wherein the timing-constraint report includes values for the presence or absence of one or more paths with a constraint error.

2. A method according to claim 1, wherein evaluating the constrained designs includes identifying nodes of each timing graph with corresponding nodes of other graphs so that elements of timing constraint sets are correspondingly identified.

3. A method according to claim 1, wherein the timing-constraint report shows the presence of one or more paths with a constraint error including a first path in a first circuit design, wherein the first path is an unconstrained active path.

4. A method according to claim 1, wherein the timing-constraint report shows the presence of one or more paths with a constraint error including a first path in a first circuit design or a second path in a second circuit design, wherein
    the first path is equivalent to the second path, and
    a first-path constraint for a minimum or maximum delay is inconsistent with a second-path constraint for a minimum or maximum delay.

5. A method according to claim 1, wherein the timing-constraint report shows the presence of one or more paths with a constraint error including a first path in a first circuit design or a second path in a second circuit design, wherein
    the first path is equivalent to the second path, and
    a first-path constraint for a minimum delay conflicts with a second-path constraint for a maximum delay.

6. A method according to claim 1, wherein the timing-constraint report shows the presence of one or more paths with a constraint error including a first path in a first circuit design or a second path in a second circuit design, wherein
    the first path is equivalent to the second path, and
    the first path is constrained as a multi-cycle path and the second path is not constrained as a multi-cycle path.

7. A method according to claim 1, wherein
    the constrained designs correspond to a plurality of modes for operation of a common circuit design, and
    the timing-constraint report shows the presence of one or more paths with a constraint error including a first path of the circuit design, wherein the first path is unconstrained across the modes for operation of the common circuit design.

8. A non-transitory computer-readable medium that stores a computer program for evaluating constrained circuit designs, wherein the computer program includes instructions for:
    specifying a plurality of constrained designs, wherein each constrained design includes a circuit design that includes circuit elements and connections between circuit elements, and each constrained design further includes timing constraints for paths along the connections between circuit elements, the timing constraints including one or more timing exceptions including false paths that are not active paths, multi-cycle paths that correspond to multiple clock cycles, maximum delays along paths, or minimum delays along paths;
    generating a timing graph for each circuit design, wherein each timing graph includes nodes corresponding to circuit elements and edges corresponding to connections between circuit elements;
    mapping the timing constraints for each circuit design to a timing-graph constraint set for a corresponding timing graph;
    evaluating the constrained designs by comparing the timing-graph constraint sets and determining a presence or absence of one or more paths with a constraint error that corresponds to an inconsistent, conflicting or missing constraint; and
    providing a timing-constraint report to a user, wherein the timing-constraint report includes values for the presence or absence of one or more paths with a constraint error.

9. A non-transitory computer-readable medium according to claim 8, wherein evaluating the constrained designs includes identifying nodes of each timing graph with corresponding nodes of other graphs so that elements of timing constraint sets are correspondingly identified.

10. A non-transitory computer-readable medium according to claim 8, wherein the timing-constraint report shows the presence of one or more paths with a constraint error including a first path in a first circuit design, wherein the first path is an unconstrained active path.

11. A non-transitory computer-readable medium according to claim 8, wherein the timing-constraint report shows the presence of one or more paths with a constraint error including a first path in a first circuit design or a second path in a second circuit design, wherein
the first path is equivalent to the second path, and
a first-path constraint for a minimum or maximum delay is inconsistent with a second-path constraint for a minimum or maximum delay.

12. A non-transitory computer-readable medium according to claim 8, wherein the timing-constraint report shows the presence of one or more paths with a constraint error including a first path in a first circuit design or a second path in a second circuit design, wherein
the first path is equivalent to the second path, and
a first-path constraint for a minimum delay conflicts with a second-path constraint for a maximum delay.

13. A non-transitory computer-readable medium according to claim 8, wherein the timing-constraint report shows the presence of one or more paths with a constraint error including a first path in a first circuit design or a second path in a second circuit design, wherein
the first path is equivalent to the second path, and
the first path is constrained as a multi-cycle path and the second path is not constrained as a multi-cycle path.

14. A non-transitory computer-readable medium according to claim 8, wherein
the constrained designs correspond to a plurality of modes for operation of a common circuit design, and
the timing-constraint report shows the presence of one or more paths with a constraint error including a first path of the circuit design, wherein the first path is unconstrained across the modes for operation of the common circuit design.

15. An apparatus for evaluating constrained circuit designs, the apparatus comprising a computer for executing computer instructions, wherein the computer includes computer instructions for:
specifying a plurality of constrained designs, wherein each constrained design includes a circuit design that includes circuit elements and connections between circuit elements, and each constrained design further includes timing constraints for paths along the connections between circuit elements, the timing constraints including one or more timing exceptions including false paths that are not active paths, multi-cycle paths that correspond to multiple clock cycles, maximum delays along paths, or minimum delays along paths;
generating a timing graph for each circuit design, wherein each timing graph includes nodes corresponding to circuit elements and edges corresponding to connections between circuit elements;
mapping the timing constraints for each circuit design to a timing-graph constraint set for a corresponding timing graph;
evaluating the constrained designs by comparing the timing-graph constraint sets and determining a presence or absence of one or more paths with a constraint error that corresponds to an inconsistent, conflicting or missing constraint; and
providing a timing-constraint report to a user, wherein the timing-constraint report includes values for the presence or absence of one or more paths with a constraint error.

16. An apparatus according to claim 15, wherein the computer includes a processor with memory for executing at least some of the computer instructions.

17. An apparatus according to claim 15, wherein the computer includes circuitry for executing at least some of the computer instructions.

18. An apparatus according to claim 15, wherein the timing-constraint report shows the presence of one or more paths with a constraint error including a first path in a first circuit design or a second path in a second circuit design, wherein
the first path is equivalent to the second path, and
a first-path constraint for a minimum or maximum delay is inconsistent with a second-path constraint for a minimum or maximum delay.

19. An apparatus according to claim 15, wherein the timing-constraint report shows the presence of one or more paths with a constraint error including a first path in a first circuit design or a second path in a second circuit design, wherein
the first path is equivalent to the second path, and
a first-path constraint for a minimum delay conflicts with a second-path constraint for a maximum delay.

20. An apparatus according to claim 15, wherein the timing-constraint report shows the presence of one or more paths with a constraint error including a first path in a first circuit design or a second path in a second circuit design, wherein
the first path is equivalent to the second path, and
the first path is constrained as a multi-cycle path and the second path is not constrained as a multi-cycle path.

21. An apparatus according to claim 15, wherein
the constrained designs correspond to a plurality of modes for operation of a common circuit design, and
the timing-constraint report shows the presence of one or more paths with a constraint error including a first path of the circuit design, wherein the first path is unconstrained across the modes for operation of the common circuit design.

* * * * *

UNITED STATES PATENT AND TRADEMARK OFFICE
CERTIFICATE OF CORRECTION

PATENT NO. : 8,209,648 B1
APPLICATION NO. : 12/553965
DATED : June 26, 2012
INVENTOR(S) : Ku et al.

It is certified that error appears in the above-identified patent and that said Letters Patent is hereby corrected as shown below:

On the title page, under "Other Publications", in column 2, line 3, after "2007", insert --.--, therefor On the title page, under "Other Publications", in column 2, line 9, delete "Flase" and insert --False--, therefor In column 8, line 59, before "on the", delete "on the", therefor Signed and Sealed this
Sixth Day of November, 2012

David J. Kappos
*Director of the United States Patent and Trademark Office*